(12) United States Patent
Yamanari et al.

(10) Patent No.: US 7,989,283 B2
(45) Date of Patent: Aug. 2, 2011

(54) MANUFACTURING METHOD OF SEMICONDUCTOR DEVICE

(75) Inventors: Shinichi Yamanari, Kanagawa (JP);
Ryoichi Yoshifuku, Kanagawa (JP);
Masaaki Shinohara, Kanagawa (JP);
Takahiro Maruyama, Kanagawa (JP);
Kenji Kawai, Kanagawa (JP); Yusaku Hirota, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/896,391

(22) Filed: Oct. 1, 2010

(65) Prior Publication Data

US 2011/0081753 A1   Apr. 7, 2011

(30) Foreign Application Priority Data

Oct. 1, 2009   (JP) ................. 2009-229225

(51) Int. Cl.
*H01L 21/8238*   (2006.01)
(52) U.S. Cl. ........ 438/199; 438/216; 438/287; 438/785; 257/274; 257/324; 257/E21.632; 257/E21.625
(58) Field of Classification Search ................ 438/199, 438/216, 287, 785; 257/274, 324, 369, 410, 257/E21.632, E21.625
See application file for complete search history.

(56) References Cited

U.S. PATENT DOCUMENTS

2010/0320542 A1* 12/2010 Kawahara et al. ............ 257/369

FOREIGN PATENT DOCUMENTS

| JP | 2003-173998 | 6/2003 |
| JP | 2005-032851 | 2/2005 |
| JP | 2005-079311 | 3/2005 |

* cited by examiner

*Primary Examiner* — Hsien-ming Lee
(74) *Attorney, Agent, or Firm* — McDermott Will & Emery LLP

(57) ABSTRACT

A manufacturing method of a semiconductor device is provided for improving the reliability of a semiconductor device including a MISFET with a high dielectric constant gate insulator and a metal gate electrode. A first Hf-containing insulating film containing Hf, La, and O as a principal component is formed as a high dielectric constant gate insulator for an n-channel MISFET. A second Hf-containing insulating film containing Hf, Al, and O as a principal component is formed as a high dielectric constant gate insulator for a p-channel MISFET. Then, a metal film and a silicon film are formed and patterned by dry etching to thereby form first and second gate electrodes. Thereafter, parts of the first and second Hf-containing insulating films not covered with the first and second gate electrodes are removed by wet etching. At this time, a wet process with an acid solution not containing hydrofluoric acid, and another wet process with an alkaline solution are performed, and then a further wet process with an acid solution containing hydrofluoric acid is performed.

16 Claims, 19 Drawing Sheets

MANUFACTURING METHOD OF SEMICONDUCTOR DEVICE

CROSS-REFERENCE TO RELATED APPLICATIONS

The disclosure of Japanese Patent Application No. 2009-229225 filed on Oct. 1, 2009 including the specification, drawings and abstract is incorporated herein by reference in its entirety.

BACKGROUND OF THE INVENTION

The present invention relates to manufacturing methods of semiconductor devices, and more particularly to a technique effectively applied to a manufacturing technology of a semiconductor device including a MISFET with a gate insulator having a high dielectric constant gate insulator and a metal gate electrode.

A metal insulator semiconductor field effect transistor (MISFET) can be manufactured by forming a gate insulator over a semiconductor substrate, forming gate electrodes over the gate insulator, and forming source and drain regions by ion implantation or the like. In general, a silicon oxide film is used as the gate insulator, and a polysilicon film is used as the gate electrode.

With miniaturization of MISFET elements, however, gate insulators have been recently thinned. In use of the polysilicon film for the gate electrode, the influence given by depletion of the gate electrode cannot be negligible. For this reason, a technique is proposed which uses a metal gate electrode as the gate electrode so as to suppress the phenomenon of depletion of the gate electrode.

The gate insulator has been thinned with the tendency toward the miniaturization of the MISFET element. When a thin silicon oxide film is used as the gate insulator, electrons flowing through a channel of the MISFET may tunnel a barrier formed by the silicon oxide film, which generates the so-called tunnel current flowing through the gate electrode. For this reason, another technique is proposed which uses the gate insulator made of a material having a dielectric constant higher than that of the silicon oxide film (that is, a high-dielectric constant material). The gate insulator has its physical thickness increased even with the same capacity as that of the silicon oxide film to thereby reduce the leak current.

Japanese Unexamined Patent Publication No. 2005-79311 (Patent Document 1) discloses a technique associated with etching of a High-k film.

Japanese Unexamined Patent Publication No. 2003-173998 (Patent Document 2) discloses a technique associated with cleaning of a semiconductor substrate.

Japanese Unexamined Patent Publication No. 2005-32851 (Patent Document 3) discloses a technique associated with etching of a High-k film.
[Related Art Documents]
[Patent Documents]
[Patent Document 1]
  Japanese Unexamined Patent Publication No. 2005-79311
[Patent Document 2]
  Japanese Unexamined Patent Publication No. 2003-173998
[Patent Document 3]
  Japanese Unexamined Patent Publication No. 2005-32851

SUMMARY OF THE INVENTION

The studies performed by the inventors have shown the following.

The use of a metal gate electrode can solve the problems of depletion of the gate electrode, but results in an increase in absolute value of a threshold voltage (threshold value) of a MISFET as compared to the case of using a polysilicon gate electrode. Specifically, a complementary metal insulator semiconductor field effect transistor (CMISFET) may have increased absolute values of the threshold values at both of an n-channel MISFET and a p-channel MISFET. Thus, it is desirable that the threshold is lowered (or that the absolute value of the threshold voltage is reduced) in application of the metal gate electrode.

A Hf-based gate insulator containing Hf is superior as the high-dielectric constant film (High-k film) for the gate insulator. Introduction of lanthanum (La) into the Hf-based gate insulator of the n-channel MISFET can lower the threshold of the n-channel MISFET. Further, introduction of aluminum (Al) into the Hf-based gate insulator of the p-channel MISFET can lower the threshold of the p-channel MISFET.

The inventors, however, have found out through studies that the Hf-based gate insulator is generally difficult to etch, and that the Hf-based gate insulator with La or Al introduced thereinto can have problems due to the etching of the Hf-based gate insulator at the time of gate etching process.

That is, when processing a metal gate electrode by dry etching, etching residues or deposited materials (reaction products) accompanied by the dry etching are attached to a main surface of the semiconductor substrate after the dry etching. In processing the metal gate electrode, the dry etching process is performed until a part of the Hf-based gate insulator not covered with the metal gate electrode is exposed. Some deposited materials (reaction products) generated by the dry etching possibly contain La (lanthanum) or Al (aluminum) contained in the Hf-based gate insulator. The part of the Hf-based gate insulator not covered with the metal gate electrode needs to be removed after processing the metal gate electrode by the dry etching. After processing the metal gate electrode by dry etching, the element La or Al generally tends to be bonded to fluorine in hydrofluoric acid to easily generate a fluoride. When the hydrofluoric acid is intended to be used in the removing process of the Hf-based gate insulator, the La or Al contained in the above deposited material (reaction products) may be bonded to the fluorine in the hydrofluoric acid to generate a La fluoride or Al fluoride. The La fluoride or Al fluoride, however, is hardly dissolved in the hydrofluoric acid. Once the La fluoride or Al fluoride is generated, the La fluoride or Al fluoride inhibits etching of the Hf-based gate insulator by the hydrofluoric acid, or remains as foreign material after the etching. This can reduce the reliability of the manufactured semiconductor device.

Accordingly, it is an object of the present invention to provide a technique that can improve the reliability of a semiconductor device including a MISFET with a high dielectric constant gate insulator and a metal gate electrode.

The above and other objects and the novel features of the invention will become apparent from the description of the present specification and the accompanying drawings.

The outline of representative aspects of the invention disclosed in the present application will be briefly described below.

A manufacturing method of a semiconductor device according to a representative embodiment includes the steps of: forming a first high dielectric constant gate insulator for an n-channel MISFET containing Hf, La, and O as a principal component, and a second high dielectric constant gate insulator for a p-channel MISFET containing Hf, Al, and O as a principal component, over a semiconductor substrate; and then forming a metal film thereover. The manufacturing method further includes the steps of: forming a first metal gate electrode of the n-channel MISFET and a second metal gate electrode of the p-channel MISFET by patterning the metal film by dry etching; and removing a part of the first high dielectric constant gate insulator not covered with the first metal gate electrode, and a part of a second high dielectric constant gate insulator not covered with the second metal gate electrode by wet etching. The wet etching step includes the steps of: performing a wet process of the semiconductor substrate with an acid solution not containing hydrofluoric acid; performing another wet process of the semiconductor substrate with an alkaline solution; and after both such steps, performing a further wet process of the semiconductor substrate with another acid solution containing hydrofluoric acid.

The effects obtained by the representative aspects of the invention disclosed in the present application will be briefly described below.

According to a representative embodiment of the invention, the reliability of the semiconductor device can be improved.

BRIEF DESCRIPTION OF THE DRAWINGS

FIG. 19 is an explanatory diagram exemplarily showing the semiconductor device in a state of being subjected to a first wet process in step S12a;

DETAILED DESCRIPTION OF THE PREFERRED EMBODIMENTS

Figure 1:
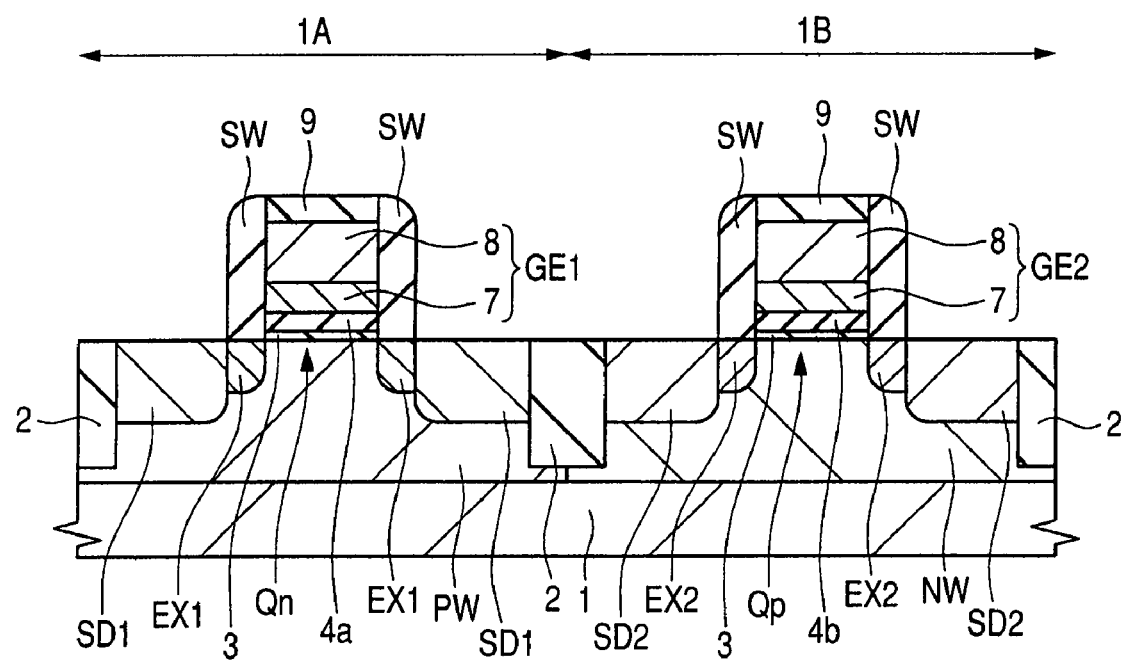
FIG. 1 is a cross-sectional view of a main part of a semiconductor device according to one embodiment of the invention.

The following preferred embodiments may be described below by being divided into a plurality of sections or embodiments for convenience, if necessary, which are not independent from each other except when specified otherwise. One of the sections or embodiments is a modified example, the details, or a supplemental explanation of a part or all of the others. When reference is made to the number of elements or the like (including the number of pieces, numerical values, quantity, range, etc.) in the following description of the embodiments, the number thereof is not limited to a specific number, and may be greater than, or less than, or equal to the specific number, unless otherwise specified and definitely limited to the specific number in principle. It is also needless to say that components (including elements or process steps, etc.) employed in the following description of the embodiments are not always essential, unless otherwise specified and considered to be definitely essential in principle. Similarly, in the description of the shapes, positional relations, and the like of the components or the like in the embodiments below, they will include those substantially analogous or similar to their shapes or the like, unless otherwise specified and considered not to be definitely so in principle, etc. This is similarly applied even to the above-described numerical values and ranges.

Now, the preferred embodiments of the invention will be described in detail below based on the accompanying drawings. Members having the same functions are designated by the same reference numerals through all drawings for explaining the embodiments of the invention, and the repeated description thereof will be omitted. The description of the same or similar parts in the following embodiments will not be repeated in principle except when necessary.

In some drawings for explaining the embodiments, hatched areas are omitted even in cross-sectional views for better understanding. Further, in other drawings, hatched areas are given even in plan views for easy understanding.

First Embodiment

A semiconductor device of this embodiment will be described below with reference to the accompanying drawings.

FIG. 1 shows a cross-sectional view of main parts of the semiconductor device according to one embodiment of the invention, that is, a semiconductor device including a complementary metal insulator semiconductor field effect transistor (CMISFET).

As shown in FIG. 1, the semiconductor device of this embodiment includes an n-channel MISFET (metal insulator semiconductor field effect transistor: MIS field effect transistor) Qn formed in an nMIS formation region (first region) 1A of a semiconductor substrate 1 and a p-channel MISFET Qp formed in a pMIS formation region (second region) 1B of the semiconductor substrate 1.

That is, the semiconductor substrate 1 made of p-type monocrystalline silicon or the like includes the nMIS formation region 1A and the pMIS formation region 1B which are defined by an element isolation region 2 and electrically separated from each other. A p-type well PW is formed in the nMIS formation region 1A of the semiconductor substrate 1, while an n-type well NW is formed in the pMIS formation region 1B of the substrate 1. A gate electrode (first metal gate electrode) GE1 of the n-channel MISFET Qn is formed over the surface of the p-type well PW in the nMIS formation region 1A via a Hf-containing insulating film (first high dielectric constant gate insulator) 4a serving as a gate insulator of the n-channel MISFET Qn. A gate electrode (second metal gate electrode) GE2 of the p-channel MISFET Qp is formed over the surface of the n-type well NW in the pMIS formation region 1B via a Hf-containing insulating film (second high dielectric constant gate insulator) 4b serving as a gate insulator of the p-channel MISFET Qp.

The Hf-containing insulating film 4a and the Hf-containing insulating film 4b can be formed directly on the surface (silicon surface) of the semiconductor substrate 1 (p-type well PW and n-type well NW) (that is, an interface layer 3 is omitted). However, an insulating interface layer (insulating layer, insulating film) 3 made of a thin silicon oxide film or silicon oxynitride film can be provided at an interface between the semiconductor substrate 1 (p-type well PW and n-type well NW) and the Hf-containing insulating films 4a and 4b. The provision of the interface layer (first insulating film) 3 made of silicon oxide or silicon oxynitride forms a $SiO_2/Si$ (or SiON/Si) structure at the interface between the gate insulator and the semiconductor substrate (silicon surface thereof), resulting in a decrease in number of defects, such as traps, to thereby improve the driving capacity and reliability.

Each of the Hf-containing insulating film 4a and the Hf-containing insulating film 4b is a film made of insulating material having a dielectric constant (relative permittivity) higher than that of silicon oxide, that is, the so-called High-k film (high dielectric constant film). The term "High-k film, high dielectric constant film, or high dielectric constant gate insulator" as used in the present application means a film having a dielectric constant (relative permittivity) higher than that of silicon oxide ($SiO_x$, typified by $SiO_2$). In the present application, the gate insulator containing Hf is sometimes hereinafter referred to as the "Hf based gate insulator".

The Hf-containing insulating film 4a functioning as a high dielectric constant gate insulator of the n-channel MISFET Qn is made of insulating material containing Hf (hafnium) and O (oxygen) as a principal component, and further containing La (lanthanum), which is one of the features of the insulating film 4a. The Hf-containing insulating film 4a contains Hf (hafnium), O (oxygen), and La (lanthanum) as essential components, but can also contain one or both of N (nitrogen) and Si (silicon) other than the above elements. The Hf-containing insulating film 4a contains La (lanthanum) so as to lower the threshold value of the n-channel MISFET Qn. The lowering of the threshold value of the MISFET corresponds to decreasing (lowering) the absolute value of the threshold value (threshold voltage) of the MISFET.

Thus, a HfLaO film, a HfLaON film, a HfLaSiON film, or a HfLaSiO film can be suitably used as the Hf-containing insulating film 4a.

The HfLaO film is a film made of insulating material containing hafnium (Hf), lanthanum (La), and oxygen (O). The HfLaON film is a film made of insulating material containing hafnium (Hf), lanthanum (La), oxygen (O), and nitrogen (N). The HfLaSiON film is a film made of insulating material containing hafnium (Hf), lanthanum (La), silicon (Si), oxygen (O), and nitrogen (N). The HfLaSiO film is a film made of insulating material containing hafnium (Hf), lanthanum (La), silicon (Si), and oxygen (O).

The term "HfLaSiON film" as used herein is not limited to a HfLaSiON film having an atomic ratio of Hf:La:Si:O:N of 1:1:1:1:1. The same goes for the HfLaO film, the HfLaON film, the HfLaSiO film, the HfAlO film, HfAlON film, the HfAlSiON film, the HfAlSiO film, the HfO film, the HfON film, the HfSiON film, the HfSiO film, and the like.

The Hf-containing insulating film 4b functioning as the high dielectric constant gate insulator of the p-channel MISFET Qp is made of insulating material containing Hf (hafnium) and O (oxygen) as a principal component, and further containing Al (aluminum), which is one of the features of the insulating film 4b. The Hf-containing insulating film 4b contains hafnium (Hf), oxygen (O), and Al (aluminum) as essential components, but can also contain one or both of N (nitrogen) and Si (silicon) in addition to the above elements. The Hf-containing insulating film 4b contains Al (aluminum)

so as to lower the threshold value of the p-channel MISFET Qp. Thus, a HfAlO film, a HfAlON film, a HfAlSiON film, or a HfAlSiO film can be suitable for use as the Hf-containing insulating film 4b.

The HfAlO film is a film made of insulating material containing hafnium (Hf), aluminum (Al), and oxygen (O). The HfAlON film is a film made of insulating material containing hafnium (Hf), aluminum (Al), oxygen (O), and nitrogen (N). The HfAlSiON film is a film made of insulating material containing hafnium (Hf), aluminum (Al), silicon (Si), oxygen (O), and nitrogen (N). The HfAlSiO film is a film made of insulating material containing hafnium (Hf), aluminum (Al), silicon (Si), and oxygen (O).

Each of the gate electrodes GE1 and GE2 includes a stacked film (stacked structure) of a metal film (metal layer, metal gate film) 7 in contact with the gate insulator (the Hf-containing insulating film 4a in the nMIS formation region 1A, and the Hf-containing insulating film 4b in the pMIS formation region 1B), and a silicon film 8 on the metal film 7. Among the gate electrodes GE1 and GE2, the gate electrode GE1 is formed in the nMIS formation region 1A, and the gate electrode GE2 is formed in the pMIS formation region 1B.

The gate electrode GE1 includes the metal film 7 in contact with the Hf-containing insulating film 4a which is the high dielectric constant gate insulator. The gate electrode GE2 includes the metal film 7 in contact with the Hf-containing insulating film 4b which is the high dielectric constant gate insulator. Each of the gate electrodes GE1 and GE2 is the so-called metal gate electrode (metallic gate electrode).

The term "metal film (metal layer)" as used in the present application means a conductive film (conductive layer) having metallic conductivity, and includes not only a single metal film (pure metal film) or an alloy film, but also a metal compound film having metallic conductivity (metal nitride film, metal carbonate film, or the like). Thus, the metal film 7 is a conductive film exhibiting the metallic conductivity and having the same low resistivity as metal. The metal film 7 is more preferably a titanium nitride (TiN) film, a tantalum nitride (TaN) film, a tungsten nitride (WN) film, a titanium carbide (TiC) film, a tantalum carbide (TaC) film, a tungsten carbide (WC) film, or a tantalum carbide nitride (TaCN) film.

In the p-type well PW within the nMIS formation region 1A, an $n^-$-type semiconductor region (extension region, LDD region) EX1, and an $n^+$-type semiconductor region (source and drain regions) SD1 having an impurity concentration higher than that of the region EX1 are formed as each of the source and drain regions of a lightly doped drain (LDD) structure of the n-channel MISFET Qn. In the n-type well NW within the pMIS formation region 1B, a $p^-$-type semiconductor region (extension region, LDD region) EX2, and a $p^+$-type semiconductor region (source and drain regions) SD2 having an impurity concentration higher than that of the region EX2 are formed as each of the source and drain regions of a LDD structure of the p-channel MISFET Qp. The $n^+$-type semiconductor region SD1 has a higher impurity concentration and a more junction depth than those of the $n^-$-type semiconductor region EX1. The $p^+$-type semiconductor region SD2 has a higher impurity concentration and a more junction depth than those of the $p^-$-type semiconductor EX2.

An insulating film 9 is formed over the gate electrodes GE1 and GE2 (the silicon film 8 thereof). The insulating film 9 is used as a hard mask in processing the gate electrodes GE1 and GE2. However, the hard mask (insulating film 9) may not be left. When an upper part of the silicon electrode (silicon film 8) is silicided (metal-silicided), the insulating film 9 may be removed in the following step (step before the siliciding process and after the gate electrode process).

A sidewall (sidewall spacer, or sidewall insulating film) SW made of insulator is formed over each of side walls of the gate electrodes GE1 and GE2. In the nMIS formation region 1A, the $n^-$-type semiconductor region EX1 is formed in alignment with the gate electrode GE1 in the nMIS formation region 1A, and the $n^+$-type semiconductor region SD1 is formed in alignment with the sidewall SW provided on each sidewall of the gate electrode GE1. In the pMIS formation region 1B, the $p^-$-type semiconductor region EX2 is formed in alignment with the gate electrode GE2, and the $p^+$-type semiconductor region SD2 is formed in alignment with the sidewall SW provided on each sidewall of the gate electrode GE2. That is, the $n^-$-type semiconductor region EX1 is positioned below the sidewall SW formed over each side wall of the gate electrode GE1, and intervenes between a channel region and the $n^+$-type semiconductor region SD1 of the n-channel MISFET Qn. The $p^-$-type semiconductor region EX2 is positioned below the sidewall SW formed over each side wall of the gate electrode GE2, and intervenes between a channel region and the $p^+$-type semiconductor region SD2 in the p-channel MISFET Qp.

Further, an insulating film (interlayer insulating film) 11 to be described later, a contact hole CNT, a plug pG, a stopper insulating film 12, an insulating film 13, a wiring M1 (see FIGS. 16 and 17 to be described later), and an upper multilayer wiring structure are formed. The illustration and description thereof will be omitted below.

Next, the manufacturing process of the semiconductor device according to this embodiment will be described below with reference to the accompanying drawings.

Figure 2:
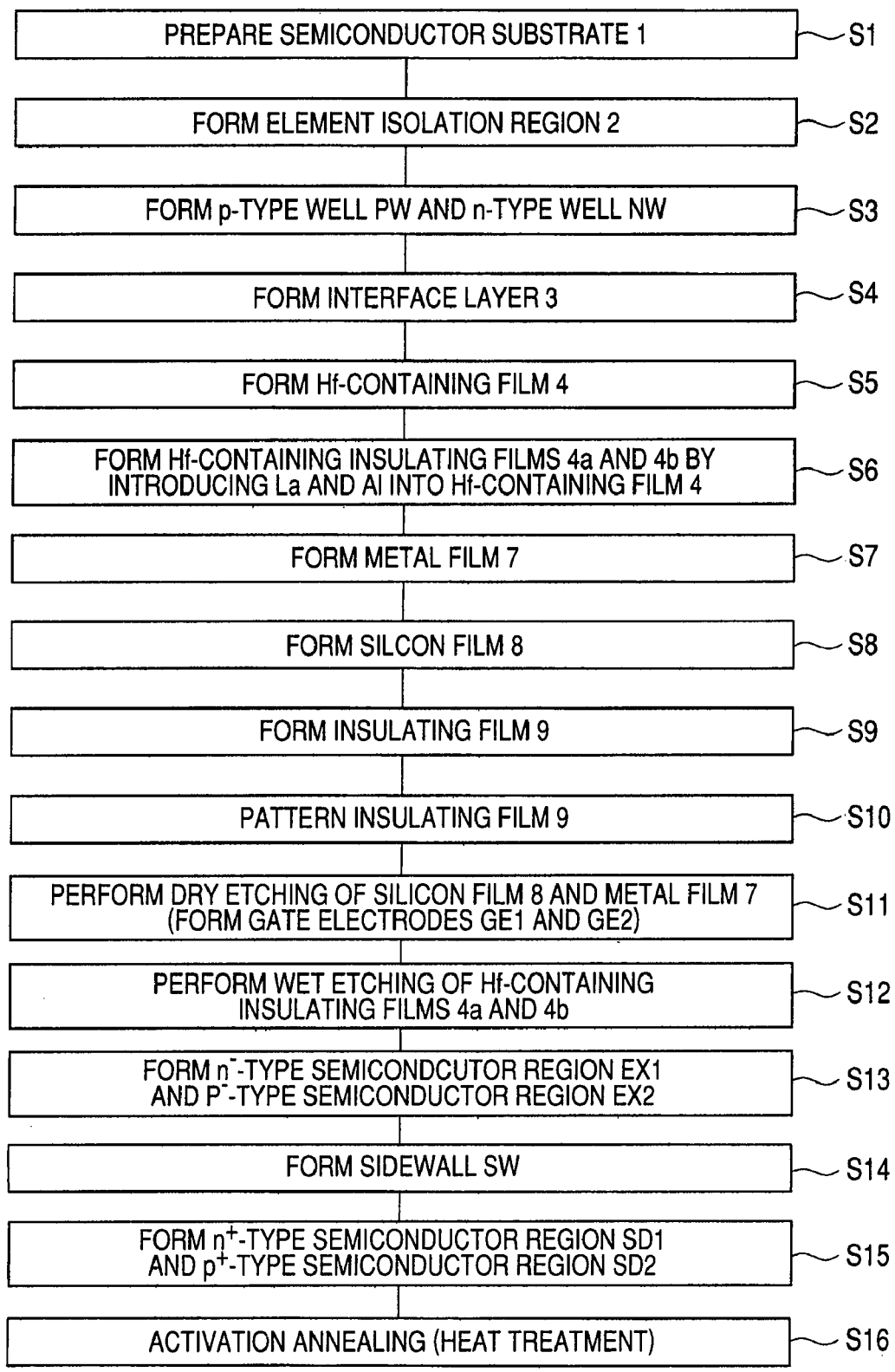
FIG. 2 is a manufacturing process flowchart showing parts of a manufacturing process of the semiconductor device according to the embodiment of the invention.
Figure 3:
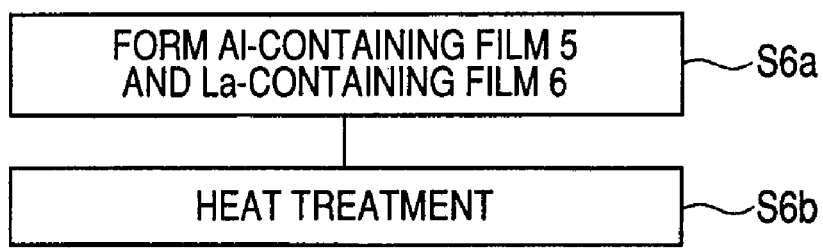
FIG. 3 is a manufacturing process flowchart showing one example of a process in step S6 of FIG. 2.
Figure 4:
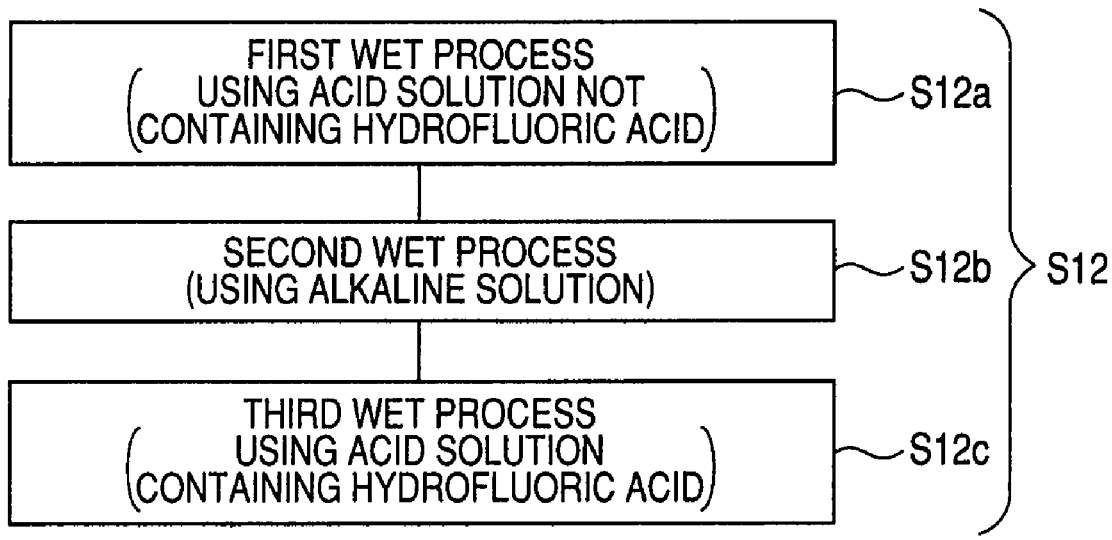
FIG. 4 is a manufacturing process flowchart showing the details of a wet etching process in step S12 of FIG. 2.

FIG. 2 is a manufacturing process flowchart showing parts of the manufacturing process of the semiconductor device of this embodiment, that is, the semiconductor device with a CMISFET. FIG. 3 is a manufacturing process flowchart showing one example of a process in step S6 of FIG. 2. FIG. 4 is a manufacturing process flowchart showing the details of a wet etching process in step S12 of FIG. 2. Each of FIGS. 5 to 17 is a cross-sectional view of a main part of the semiconductor device of this embodiment, that is, the semiconductor device with the CMISFET in a corresponding manufacturing step.

Figure 5:
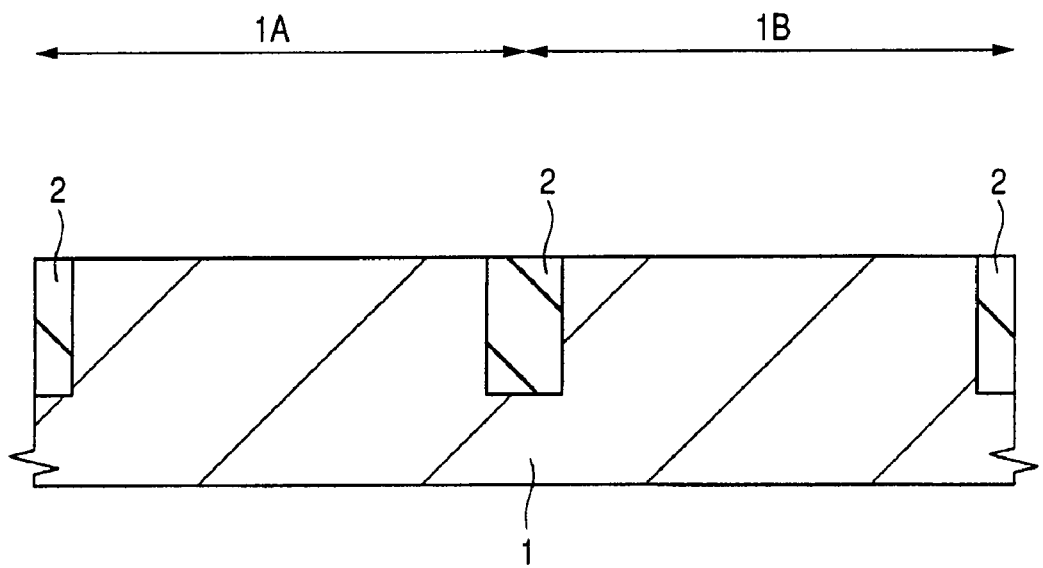
FIG. 5 is a cross-sectional view of a main part of the semiconductor device in a manufacturing step according to the embodiment of the invention.

First, as shown in FIG. 5, a semiconductor substrate (semiconductor wafer) 1 made of p-type monocrystalline silicon having a specific resistance, for example, of about 1 to 10 Ωcm is prepared (provided in advance) (in step S1 shown of FIG. 2). The semiconductor substrate 1 where the semiconductor device of this embodiment is to be formed thereover includes the nMIS formation region 1A for formation of the n-channel MISFET, and the pMIS formation region 1B for formation of the p-channel MISFET. Then, the element isolation region 2 is formed over a main surface of the semiconductor substrate 1 (in step S2 in FIG. 2). The element isolation region 2 is formed of an insulator, such as silicon oxide, for example, by a shallow trench isolation (STI) method. For example, the element isolation regions 2 can be formed by an insulating film embedded in trenches formed in the semiconductor substrate 1 (element isolation trenches).

Figure 6:
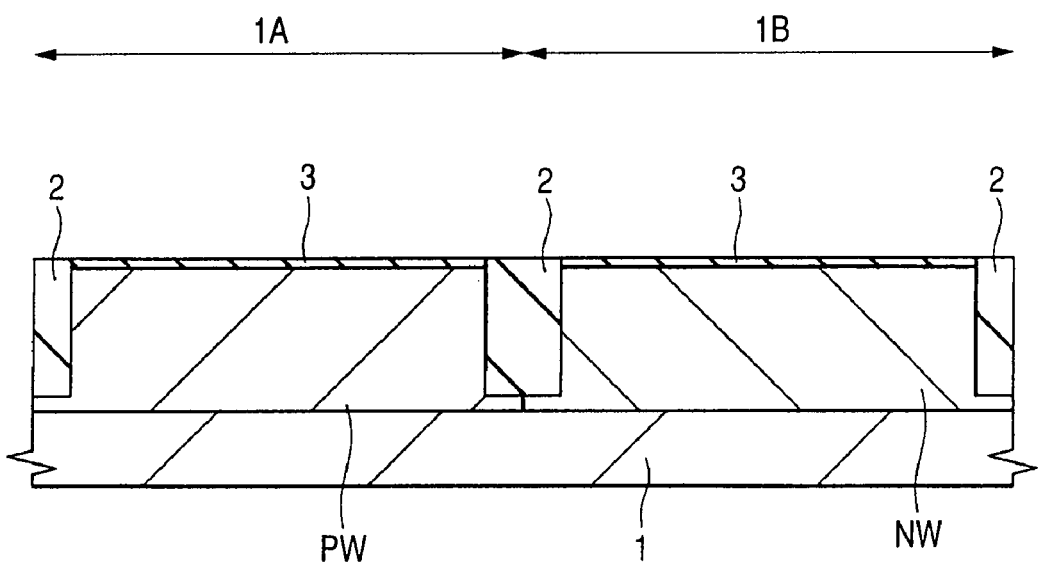
FIG. 6 is a cross-sectional view of a main part of the semiconductor device in a manufacturing step following the step shown in FIG. 5.

Then, as shown in FIG. 6, the p-type well PW is formed in a region (nMIS formation region 1A) of the semiconductor substrate 1 where the n-channel MISFET is to be formed, and the n-type well NW is formed in a region (pMIS formation region 1B) of the substrate 1 where the p-channel MISFET is to be formed (in step S3 in FIG. 2). In step S3, the p-type well PW is formed by implanting ions of p-type impurities, such as boron (B), and the n-type well NW is formed by implanting ions of n-type impurities, such as phosphorus (P) or arsenic (As). Before or after formation of the p-type well PW and the n-type well NW, ion implantation for adjusting the threshold of the MISFET to be formed later (namely, the so-called channel dope ion implantation) can be performed into the upper layer of the semiconductor substrate 1 if necessary.

Then, a natural oxide film on the surface of the semiconductor substrate 1 is removed, for example, by wet etching using hydrofluoric acid (HF) aqueous solution thereby to clean (wash) the surface of the semiconductor substrate 1. Thus, the surface (silicon surface) of the semiconductor substrate 1 (p-type well PW and n-type well NW) is exposed.

Then, an interface layer (insulating layer, first insulating film) 3 is formed of a silicon oxide film or a silicon oxynitride film over the surface (that is, the surfaces of the p-type well PW and n-type well NW) of the semiconductor substrate 1 (in step S4 in FIG. 2).

The Hf-based high dielectric constant gate insulator can be formed directly on the surface (silicon surface) of the semiconductor substrate 1 (p-type well PW) by omitting the process in step S4 without forming the interface layer 3. However, more preferably, after forming the interface layer 3 in step S4, the Hf-based high dielectric constant gate insulator is formed over the interface layer 3, which can reduce the number of defects, including traps, thus improving the driving capacity and reliability. In the case of forming the interface layer 3, the interface layer 3 is thin, and can preferably have a thickness of 0.3 to 1 nm, for example, about 0.6 nm. In step S4, the interface layer 3 can be formed, for example, using a thermal oxidation method or the like.

Figure 7:
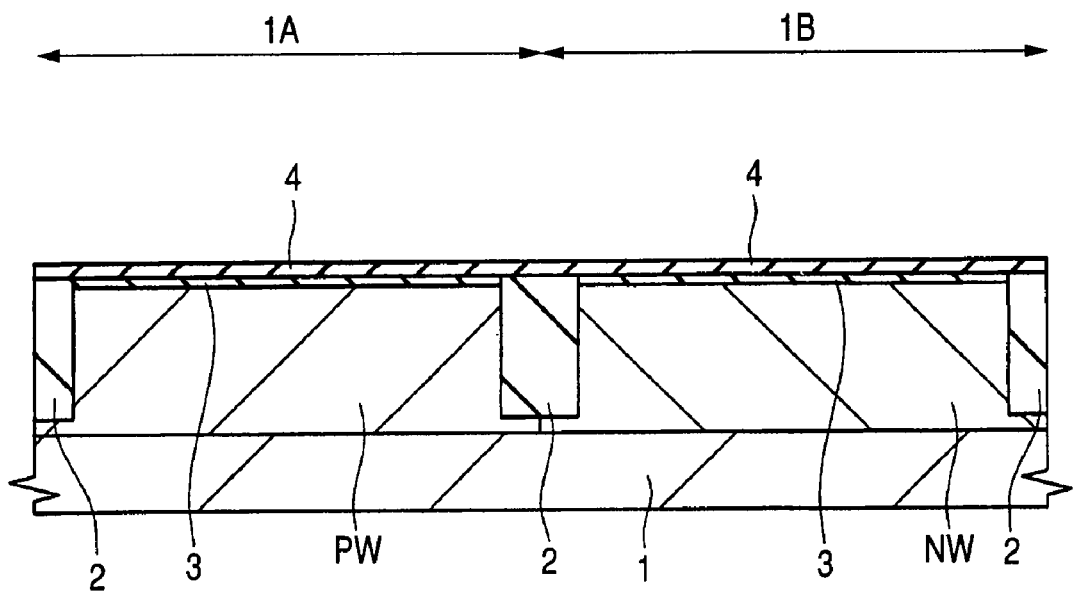
FIG. 7 is a cross-sectional view of a main part of the semiconductor device in a manufacturing step following the step shown in FIG. 6.

Then, as shown in FIG. 7, a Hf-containing film (Hf-containing layer, or first Hf-containing film) 4 is formed over the main surface of the semiconductor substrate 1, that is, over the interface layer 3 (in step S5 in FIG. 2). The Hf-containing film 4 is formed over the entire main surface of the semiconductor substrate 1 in step S5, so that the Hf-containing film 4 is formed both in the nMIS formation region 1A and the pMIS formation region 1B. The Hf-containing film 4 is an insulating film serving as a basis for formation of the high dielectric constant gate insulator (that is, the above Hf-containing films 4a and 4b) of the above n-channel MISFET Qn and p-channel MISFET Qp.

The Hf-containing film 4 is comprised of an insulating material containing Hf (hafnium), and oxygen (O), and preferably, can be a HfO film (hafnium oxide film, typified by a $HfO_2$ film), a HfON film (hafnium oxynitride film), a HfSiON film (hafnium silicon oxynitride film), or a HfSiO film (hafnium silicate film). The use of the HfON film as the Hf-containing film 4 can achieve improvement of the heat resistance, and further reduction in leak current. Thus, the Hf-containing film 4 can be regarded as an insulating film containing hafnium (Hf) and oxygen (O) as a principal component. The Hf-containing film 4 can have a thickness (formed thickness) of, for example, about 0.5 to 2 mm.

The process for forming the Hf-containing film 4 in step S5 can be performed, for example, in the following way.

In a case where the Hf-containing insulating film 4 is a HfSiON film, the HfSiO film is first deposited by an atomic layer deposition (ALD) method or a chemical vapor deposition (CVD) method. Then, the HfSiO film is nitrided by a nitriding process, such as a plasma nitriding process (that is, the HfSiO film is nitrided to be converted into a HfSiON film), so that the HfSiON film can be formed. After the nitriding process, the heat treatment may be performed under an inactive or oxidizing atmosphere in some cases.

In a case where the Hf-containing film 4 is a HfON film, a HfO film (typified by the $HfO_2$ film) is first deposited by using the ALD method or CVD method, and then nitrided by the plasma nitriding process (that is, to convert the HfO film into the HfON film), so that the HfON film can be formed. After the nitriding process, the heat treatment may be performed under an inactive or oxidizing atmosphere in some cases.

In a case where the Hf-containing film 4 is a HfO film (typified by the $HfO_2$ film), the HfO film (typified by the $HfO_2$ film) may be deposited using the ALD method or CVD method, which does not need the nitriding process.

In a case where the Hf-containing film 4 is a HfSiO film, the HfSiO film may be deposited using the ALD method or CVD method, which does not need the nitriding process.

In order to lower the threshold value of each of the n-channel MISFET Qn and the p-channel MISFET Qp, after forming the Hf-containing film 4 in step S5, La (lanthanum) is introduced into the Hf-containing film 4 in the nMIS formation region 1A to form the Hf-containing insulating film 4a containing La, and Al (aluminum) is introduced into the Hf-containing film 4 in the pMIS formation region 1B to form the Hf-containing insulating film 4b containing Al (in step S6 in FIG. 2). The following will describe one example (steps S6a and S6b in FIG. 3) of a method for introducing La (lanthanum) into the Hf-containing film 4 in the nMIS formation region 1A and for introducing Al (aluminum) into the Hf-containing film 4 in the pMIS formation region 1B in step S6.

Figure 8:
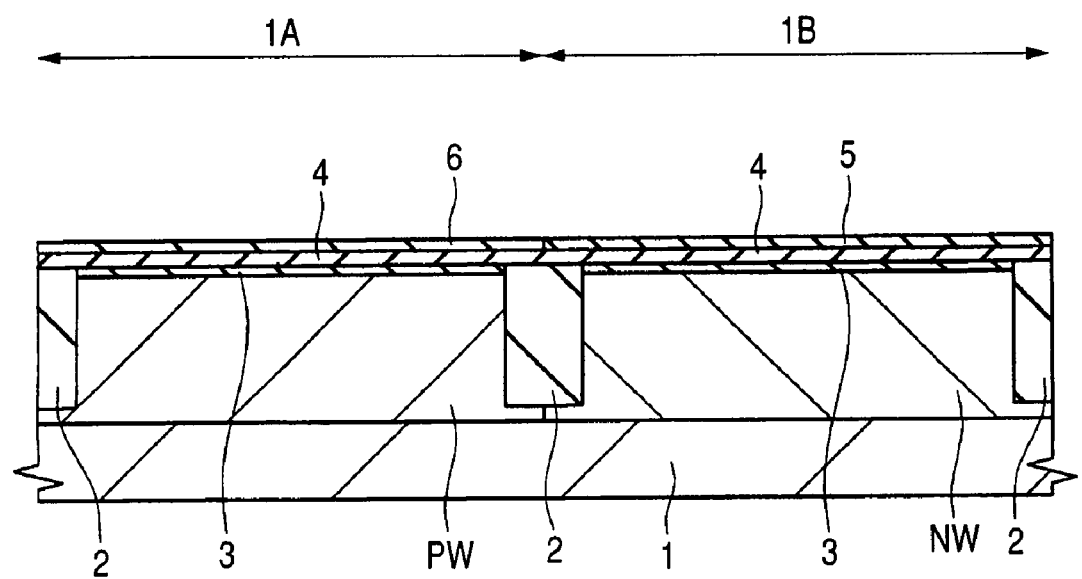
FIG. 8 is a cross-sectional view of a main part of the semiconductor device in a manufacturing step following the step shown in FIG. 7.

After forming the Hf-containing film 4, as shown in FIG. 8, an Al-containing film (Al-containing layer) 5 containing Al is formed over the Hf-containing film 4 within the pMIS formation region 1B so as to be in contact with the Hf-containing film 4 in the pMIS formation region 1B. A La-containing film (La-containing layer) 6 containing La is formed over the Hf-containing film 4 within the nMIS formation region 1A so as to be in contact with the Hf-containing film 4 in the nMIS formation region 1A (in step S6a in FIG. 3). In order to achieve this arrangement, for example, the Al-containing film 5 is formed over the entire main surface of the semiconductor substrate 1 covering the nMIS formation region 1A and the pMIS formation region 1B. Then, a part of the Al-containing film 5 outside the pMIS formation region 1B is removed by photolithography and etching (that is, the Al-containing film 5 within the nMIS formation region 1A is removed), whereby the Al-containing film 5 may be maintained only in the pMIS formation region 1B. Further, the La-containing film 6 is formed over the entire main surface of the semiconductor substrate 1 covering the nMIS formation region 1A and the pMIS formation region 1B. Then, a part of the La-containing film 6 outside the nMIS formation region 1A is removed by photolithography and etching (that is, the La-containing film 6 within the pMIS formation region 1B is removed), whereby the La-containing film 6 may be maintained only in the nMIS formation region 1A.

The Al-containing film 5 contains Al (aluminum) as a principal component. As the Al-containing film 5, an aluminum oxide film (AlO film, typified by $Al_2O_3$ film) is most preferable, but other aluminum films, such as an aluminum oxynitride film (AlON film) or an aluminum film (Al film), can also be used. The Al-containing film 5 can be formed by sputtering or ALD method so as to have a thickness (formation thickness) of, for example, about 0.3 to 1 nm.

The La-containing film 6 contains La (lanthanum) as a principal component. From the viewpoint of stability, the La-containing film 6 is preferably a lanthanum oxide film (lanthanum oxide layer, typified by $La_2O_3$ as a lanthanum oxide). The La-containing film 6 can be formed by the sputtering or ALD method so as to have a thickness (formation thickness) of, for example, about 0.3 to 1 nm.

Then, heat treatment is applied to the semiconductor substrate 1 (in step S6b of FIG. 3). The heat treatment process in step S6b can be performed at a heat treatment temperature in a range of 600 to 1000° C. under an inert gas atmosphere (which may be a nitrogen gas atmosphere instead). By the heat treatment in step S6b, the Hf-containing film 4 reacts with the La-containing film 6 in the nMIS formation region 1A, and with the Al-containing film 5 in the pMIS formation region 1B, respectively. That is, by the heat treatment in step S6b, the La contained in the La-containing film 6 is introduced (diffused) into the Hf-containing film 4 in the nMIS formation region 1A, and the Al contained in the Al-containing film 5 is introduced (diffused) into the Hf-containing film 4 in the pMIS formation region 1B.

Figure 9:
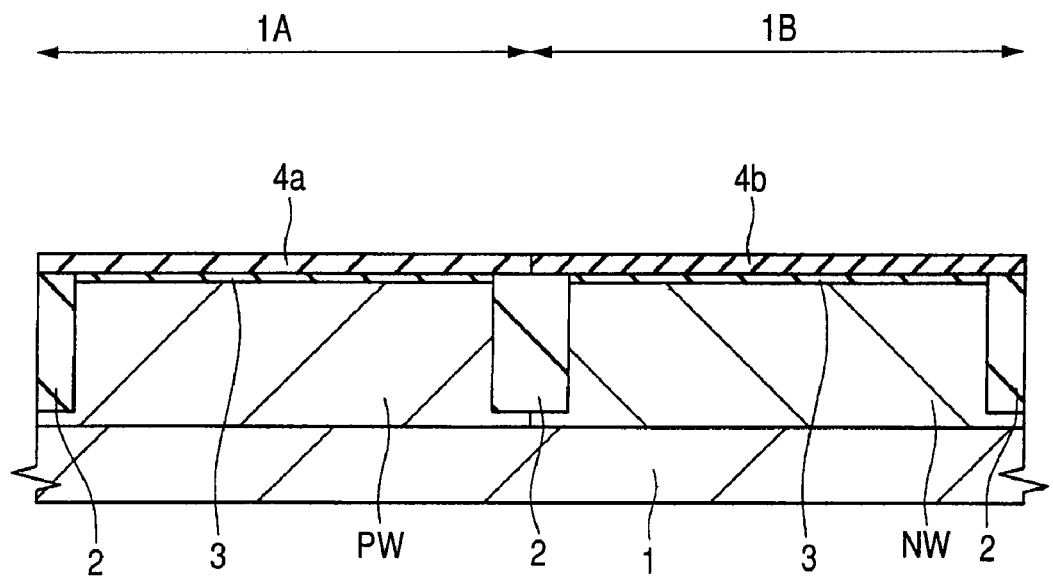
FIG. 9 is a cross-sectional view of a main part of the semiconductor device in a manufacturing step following the step shown in FIG. 8.

In the heat treatment at step S6b, the Hf-containing film 4 reacts (mixes, or interdiffuses) with the La-containing film 6 in the nMIS formation region 1A to form the Hf-containing insulating film 4a which is a reaction layer (mixed layer) between the Hf-containing film 4 and the La-containing film 6 as shown in FIG. 9. That is, in the nMIS formation region 1A, the La contained in the La-containing film 6 is introduced into the Hf-containing film 4, so that the Hf-containing film 4 is converted into the Hf-containing insulating film 4a.

The Hf-containing film 4 contains hafnium (Hf) and oxygen (O) as a principal component, and the La-containing film 6 contains lanthanum (La) as a principal component. Thus, the Hf-containing insulating film 4a formed by reaction between the Hf-containing film 4 and the La-containing film 6 in the nMIS formation region 1A becomes an insulating film containing hafnium (Hf), oxygen (O), and lanthanum (La) as a principal component. When the Hf-containing film 4 contains not only hafnium (Hf) and oxygen (O), but also nitrogen (N), the Hf-containing insulating film 4a formed contains not only hafnium (Hf), oxygen (O), and lanthanum (La), but also nitrogen (N). When the Hf-containing film 4 contains not only hafnium (Hf) and oxygen (O), but also silicon (Si), the Hf-containing insulating film 4a formed contains not only hafnium (Hf), oxygen (O), and lanthanum (La), but also silicon (Si).

The La-containing film 6 is preferably a lanthanum oxide film as mentioned above. In this case, although the La-containing film 6 also contains oxygen (O) in addition to the lanthanum (La), the Hf-containing film 4 also contains oxygen (O), whereby the Hf-containing insulating film 4a contains oxygen (O) regardless of whether the La-containing film 6 contains oxygen (O). That is, the La-containing film 6 preferably contains oxygen (O) in addition to lanthanum (La). The Hf-containing insulating film 4a contains oxygen (O) regardless of the presence or absence of oxygen (O) in the La-containing film 6.

Thus, in the case of the Hf-containing film 4 comprised of the HfSiON film, the Hf-containing insulating film 4a becomes a HfLaSiON film. In the case of the Hf-containing film 4 comprised of the HfSiO film, the Hf-containing insulating film 4a becomes a HfLaSiO film. In the case of the Hf-containing film 4 comprised of the HfON film, the Hf-containing insulating film 4a becomes a HfLaON film. In the case of the Hf-containing film 4 comprised of the HfO film (typified by a HfO$_2$ film), the Hf-containing insulating film 4a becomes a HfLaO film.

In the heat treatment at step S6b, the Hf-containing film 4 reacts (mixes, or interdiffuses) with the Al-containing film 5 in the pMIS formation region 1B to form the Hf-containing insulating film 4b which is a reaction layer (mixed layer) between the Hf-containing film 4 and the Al containing film 5 as shown in FIG. 9. That is, in the pMIS formation region 1B, the Al contained in the Al-containing film 5 is introduced into the Hf-containing film 4, so that the Hf-containing film 4 is converted into the Hf-containing insulating film 4b.

The Hf-containing film 4 contains hafnium (Hf) and oxygen (O) as a principal component, and the Al-containing film 5 contains Al (aluminum) as a principal component. Thus, the Hf-containing insulating film 4b formed by reaction between the Hf-containing film 4 and the Al-containing film 5 in the pMIS formation region 1B becomes an insulating film containing hafnium (Hf), oxygen (O), and aluminum (Al) as a principal component. When the Hf-containing film 4 contains not only hafnium (Hf) and oxygen (O), but also nitrogen (N), the Hf-containing insulating film 4b formed contains not only hafnium (Hf), oxygen (O), and aluminum (Al), but also nitrogen (N). When the Hf-containing film 4 contains not only hafnium (Hf), and oxygen (O), but also silicon (Si), the Hf-containing insulating film 4b formed contains not only hafnium (Hf), oxygen (O), and aluminum (Al), but also silicon (Si).

Thus, in a case where the Al-containing film 5 is an aluminum oxide film or an aluminum film, the Hf-containing insulating film 4b becomes a film having the following composition depending on the kind of the Hf-containing film 4. That is, in the case of the Hf-containing film 4 comprised of the HfO film (typified by a HfO$_2$ film), the Hf-containing insulating film 4b becomes a HfAlO film. In the case of the Hf-containing film 4 comprised of the HfON film, the Hf-containing insulating film 4b becomes a HfAlON film. In the case of the Hf-containing film 4 comprised of the HfSiO film, the Hf-containing insulating film 4b becomes a HfAlSiO film. In the case of the Hf-containing film 4 comprised of the HfSiON film, the Hf-containing insulating film 4b becomes a HfAlSiON film. In the case of the Al-containing film 5 comprised of the aluminum oxynitride film, the Hf-containing insulating film 4b becomes a film having the following composition depending on the kind of the Hf-containing film 4. That is, in the case of the Hf-containing film 4 comprised of the HfO film (typified by HfO$_2$ film) or the HfON film, the Hf-containing insulating film 4b becomes a HfAlON film. In the case of the Hf-containing film 4 comprised of the HfSiO film or HfSiON film, the Hf-containing insulating film 4b becomes a HfAlSiON film.

When performing the heat treatment (heat treatment in step S6) for forming the Hf-containing insulating films 4a and 4b in the case where the interface layer 3 is formed in step S4 before forming the Hf-containing film 4 in step S5, the silicon oxide film or silicon oxynitride film as the interface layer 3 is preferably left by suppressing the reaction between the Hf-containing film 4 and the lower interface layer 3. That is, preferably, the silicon oxide film or silicon oxynitride film is left as the interface layer 3 between the Hf-containing insulating film 4a and the semiconductor substrate 1 (p-type well PW) in the nMIS formation region LA. The silicon oxide film or silicon oxynitride film is left as the interface layer 3 between the Hf-containing insulating film 4b and the semiconductor substrate 1 (n-type well NW) in the pMIS formation region 1B. This can manufacture a good device which suppresses the degradation in driving power and reliability.

In some cases, depending on the formation thickness of the Al-containing film 5 and the La-containing film 6, the La-containing film 6 not reacting in the heat treatment process in step S6b (that is, an unreacted part of the La-containing film 6) remains thinly on the Hf-containing insulating film 4a in a layered form after the heat treatment process in step S6b. Further, the Al-containing film 5 not reacting in the heat treatment process in step S6b (that is, an unreacted part of the Al-containing film 5) remains thinly on the Hf-containing insulating film 4b in a layered form. In such a case, a formation process of the metal film 7 can be performed in step S7 to be described later while leaving the unreacted part of the La-containing film 6 on the Hf-containing insulating film 4a and the unreacted part of the Al-containing film 5 on the Hf-containing insulating film 4b. Alternatively, the unreacted part of the La-containing film 6 and the unreacted part of the Al-containing film 5 can be removed by etching (preferably, by wet etching) after the heat treatment in step S6b and before the formation process of the metal film 7 in step S7 to be described later.

In this way, a structure shown in FIG. 9 can be obtained in which the Hf-containing insulating film 4a with La introduced thereinto is formed over the main surface of the semiconductor substrate 1 in the nMIS formation region 1A, and the Hf-containing insulating film 4b with Al introduced thereinto is formed over the main surface of the semiconductor substrate 1 in the pMIS formation region 1B.

One example of the method for forming the Hf-containing insulating film 4a containing La in the nMIS formation region 1A and the Hf-containing insulating film 4b containing Al in the pMIS formation region 1B in step S6 (processes in steps S6a and S6b in FIG. 3) has been described above, but the invention is not limited thereto. The use of other methods (for example, a method according to a second embodiment to be described later) may form the Hf-containing insulating film 4a containing La in the nMIS formation region 1A, and the Hf-containing insulating film 4b containing Al in the pMIS formation region 1B.

Figure 10:
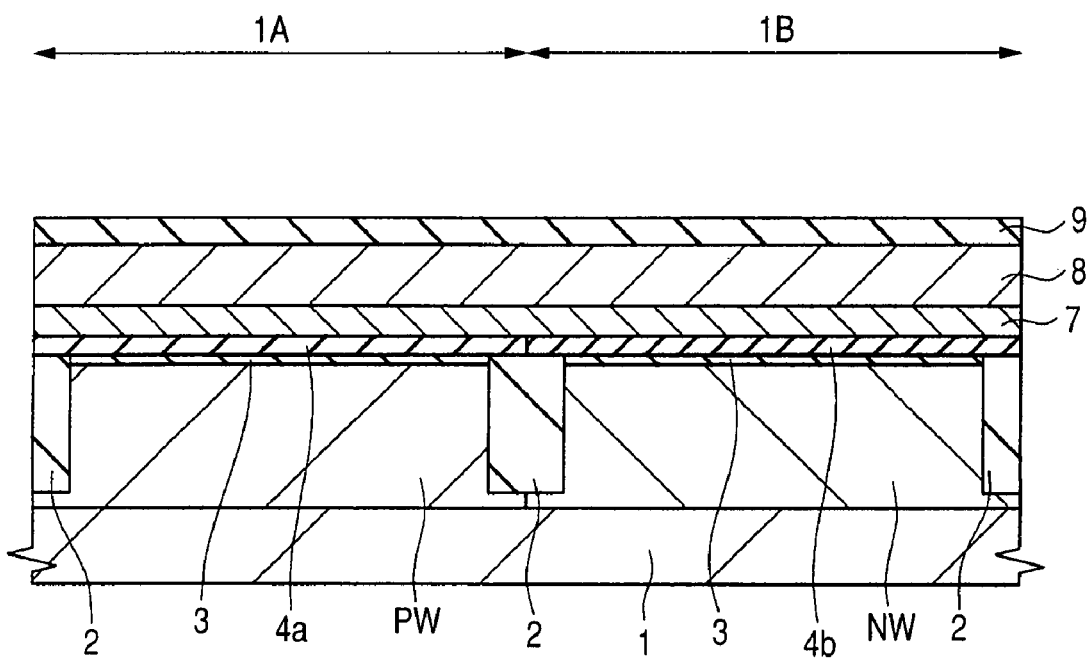
FIG. 10 is a cross-sectional view of a main part of the semiconductor device in a manufacturing step following the step shown in FIG. 9.

Then, as shown in FIG. 10, a metal film (metal layer, metal gate film) 7 for a metal gate (metal gate electrode) is formed over the main surface of the semiconductor substrate 1 covering the nMIS formation region 1A and the pMIS formation region 1B, that is, over the Hf-containing insulating film 4a in the nMIS formation region 1A and the Hf-containing insulating film 4b in the pMIS formation region 1B (in step S7 of FIG. 2).

The metal film 7 is preferably a titanium nitride (TiN) film, a tantalum nitride (TaN) film, a tungsten nitride (WN) film, a titanium carbide (TiC) film, a tantalum carbide (TaC) film, a tungsten carbide (WC) film, or a tantalum carbide nitride (TaCN) film. The metal film 7 can be formed, for example, by sputtering or the like. The metal film 7 can have a thickness of, for example, about 5 to 20 nm.

Then, the silicon film 8 is formed over the main surface of the semiconductor substrate 1, that is, on the metal film 7 (in step S8 of FIG. 2). The silicon film 8 can be a polycrystalline silicon film or an amorphous silicon film. Even when the silicon film 8 is formed as the amorphous silicon film, the silicon film 8 becomes a polycrystalline silicon film by being subjected to the heat treatment after formation of the film (for example, by an activation annealing process in step S16 to be described later). The silicon film 8 can have a thickness of, for example, about 100 nm. In other embodiments, a silicon film containing germanium (Ge) (silicon germanium film) can be used as the silicon film 8.

The formation process of the silicon film 8 in step S8 can be omitted by thickening the metal film 7 formed in step S7 (that is, the gate electrodes GE1 and GE2 can be formed of the metal film 7 without the silicon film 8). However, the silicon film 8 is more preferably formed over the metal film 7 in step S8 (that is, the gate electrodes GE1 and GE2 are formed of a stacked film of the metal film 7 and the silicon film 8 thereon). The reason for this is that the very thick metal film 7 tends to be peeled off, or can cause damage to the substrate due to over-etching in patterning the metal film 7. Further, the formation of the gate electrode using the stacked film of the metal film 7 and the silicon film 8 can thin the metal film 7 as compared to the formation of the gate electrode using only the metal film 7, which can improve the above problems. The formation of the silicon film 8 on the metal film 7 can follow the conventional processing method or manufacturing process of a polysilicon gate electrode (gate electrode comprised of polysilicon), and hence holds superiority in microfabrication property, manufacturing cost, and yield.

Then, the insulating film 9 is formed of silicon nitride or the like over the main surface of the semiconductor substrate 1, that is, the silicon film 8 (in step S9).

Up to this step, in the nMIS formation region 1A, the interface layer 3, the Hf-containing insulating film 4a, the metal film 7, the silicon film 8, and the insulating film 9 are stacked over the semiconductor substrate 1 (p-type well PW) in that order from the bottom. In the pMIS formation region 1B, the interface layer 3, the Hf-containing insulating film 4b, the metal film 7, the silicon film 8, and the insulating film 9 are stacked over the semiconductor substrate 1 (n-type well NW) in that order from the bottom.

Figure 11:
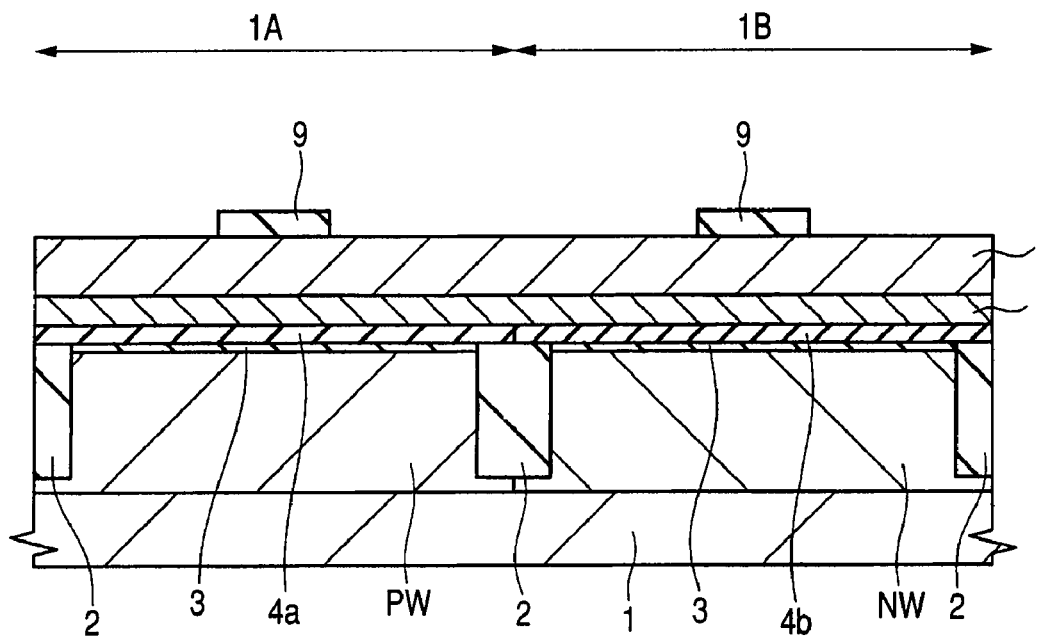
FIG. 11 is a cross-sectional view of a main part of the semiconductor device in a manufacturing step following the step shown in FIG. 10.

Then, a photoresist pattern (not shown) is formed over the insulating film 9 using photolithography. The insulating film 9 is dry etched to be patterned using the photoresist pattern as an etching mask as shown in FIG. 11 (in step S11). Thereafter, the photoresist pattern is removed. The patterned insulating film 9 acts as a hard mask for processing of the gate, and is arranged in an area where the gate electrodes GE1 and GE2 are to be formed.

Figure 12:
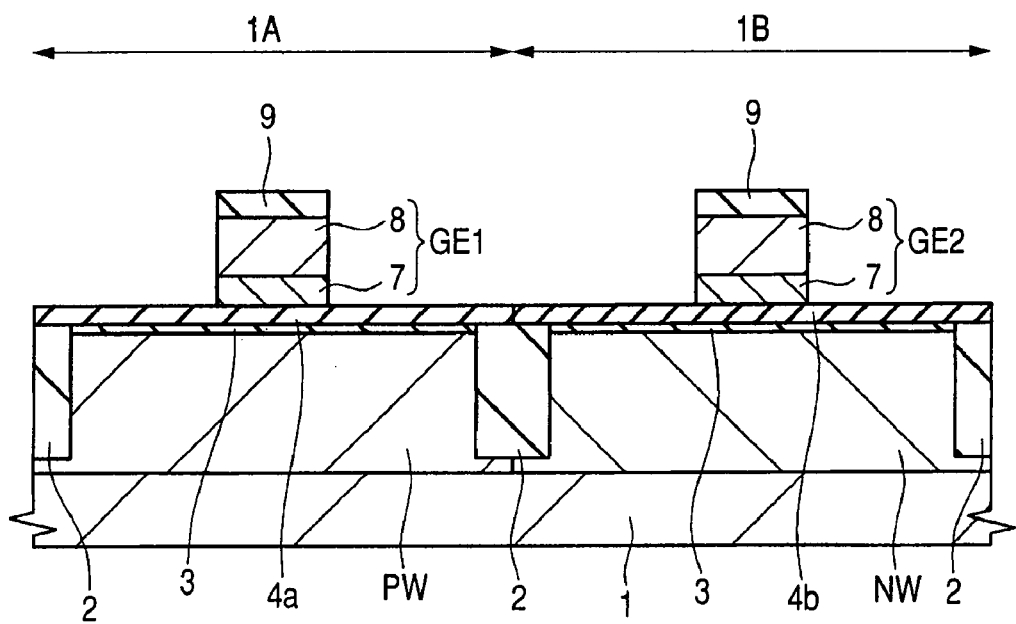
FIG. 12 is a cross-sectional view of a main part of the semiconductor device in a manufacturing step following the step shown in FIG. 11.

Then, the stacked film of the silicon film 8 and the metal film 7 are dry etched and patterned using the insulating film 9 (that is, the insulating film 9 patterned in step S10) as an etching mask, so that the gate electrodes GE1 and GE2 are formed of the metal film 7 and the silicon film 8 on the metal film 7 as shown in FIG. 12 (in step S11 of FIG. 2). The parts of the silicon film 8 and the metal film 7 not covered with the insulating film 9 are removed by the dry etching process in step S11 to thereby form the gate electrodes GE1 and GE2 comprised of the patterned metal film 7 and the silicon film 8 with the high dielectric constant insulating films (here, the Hf-containing insulating films 4a and 4b) exposed in the positions not covered with the gate electrodes GE1 and GE2. That is, the part of the Hf-containing insulating film 4a not covered with the gate electrode GE1 in the nMIS formation region 1A, and the part of the Hf-containing insulating film 4b not covered with the gate electrode GE2 in the pMIS formation region 1B are exposed by the dry etching process in step S11.

In the dry etching process in step S11, the Hf-containing insulating films 4a and 4b serve as an etching stopper. The dry etching process in step S11 is stopped when the surfaces of the parts of the Hf-containing insulating films 4a and 4b not covered with the gate electrodes GE1 and GE2 are exposed, or when only the superficial parts of the Hf-containing insulating films 4a and 4b are removed after etching the Hf-containing insulating films 4a and 4b. Thus, when the dry etching process in step S11 is finished, the part of the Hf-containing insulating film 4a not covered with the gate electrode GE1, and the part of the Hf-containing insulating film 4b not covered with the gate electrode GE2 at least partially remain in a layered form. If all parts of the Hf-containing insulating films 4a and 4b not covered with the gate electrodes GE1 and GE2 are intended to be removed by the dry etching process in step S11, the semiconductor substrate 1 may be damaged due to the over-etching. Therefore, in the dry etching process in step S11, at least parts of the respective Hf-containing insulating films 4a and 4b preferably remain in the layered form using the Hf-containing insulating films 4a and 4b as an etching stopper.

The dry etching process in step S11 can be performed, for example, in the following way. First, the silicon film 8 is dry etched using as an etching gas, for example, a mixed gas of a gas containing at least Cl (chlorine) and a gas containing Br (bromine) (more specifically, a mixed gas of $Cl_2$ gas, HBr gas, and Ar gas). Alternatively, the silicon film 8 is dry etched using a mixed gas further containing an acidic gas in addition to the above gas (more specifically, a mixed gas of $Cl_2$ gas, HBr gas, and $O_2$ gas) so as to enhance an etching selectivity with respect to the metal film 7 as an underlayer. Subsequently, for example, the metal film 7 is dry etched using as an etching gas, a mixed gas containing a gas containing Cl (chlorine), a gas containing Br (bromine), and a gas containing N (nitrogen) (more specifically, a mixed gas of $Cl_2$ gas, HBr gas, and $N_2$ gas). Then, the superficial parts of the high dielectric constant insulating films (here, Hf-containing insulating films 4a and 4b) can be dry etched using a mixed gas containing $BCl_3$ as an etching gas. The dry etching using such various gases can be continuously performed by disposing the semiconductor substrate 1 in a chamber (not shown) of a dry etching device and changing the etching gas as described above.

The gate electrode GE1 is formed over the Hf-containing insulating film 4a in the nMIS formation region 1A, and the gate electrode GE2 is formed over the Hf-containing insulating film 4b in the pMIS formation region 1B. That is, the gate electrode GE1 comprised of the metal film 7 and the silicon film 8 on the metal film 7 is formed over the surface of the p-type well pW in the nMIS formation region 1A via the Hf-containing insulating film 4a serving as the gate insulator. The gate electrode GE2 comprised of the metal film 7 and the silicon film 8 on the metal film 7 is formed over the surface of the n-type well NW in the pMIS formation region 1B via the Hf-containing insulating film 4b serving as the gate insulator. The Hf-containing insulating film 4a positioned below the gate electrode GE1 and the Hf-containing insulating film 4b positioned below the gate electrode GE2 serve as a high dielectric constant gate insulator having a dielectric constant (relative permittivity) higher than that of silicon oxide.

The dry etching of the silicon film 8 and the metal film 7 using the insulating film 9 as the hard mask has been described above. In another embodiment, the formation process of the insulating film 9 in step S9 and the patterning process of the insulating film 9 in step S10 will be omitted. In step S11, a photoresist pattern (which may be a multilayer resist) is formed over the silicon film 8, and then the silicon film 8 and the metal film 7 are dry-etched and patterned using the photoresist pattern as an etching mask, whereby the gate electrodes GE1 and GE2 can be formed. The photoresist pattern used at this time is removed after patterning the silicon film 8 and the metal film 7. In this case, as shown in FIG. 12, the structure without the insulating film 9 on the silicon film 8 included in the gate electrodes GE1 and GE2 is obtained.

After the dry etching process for patterning the silicon film 8 and the metal film 7 in step S11, wet etching is performed for removing the part of the Hf-containing insulating film 4a not covered with the gate electrode GE1 and the part of the Hf-containing insulating film 4b not covered with the gate electrode GE2 (in step S12 of FIG. 2).

The wet etching process in step S12 includes the following three kinds of wet processes (that is, the processes in steps S12a, S12b, and S12c of FIG. 4), which is one feature of the wet etching process.

First, in a first wet process in step S12a, the semiconductor substrate 1 is subjected to a wet treatment (cleaning process) with an acid solution (first acid solution). The acid solution (first acid solution) used in the first wet process in step S12a does not contain hydrofluoric acid (HF), which is one feature of the first wet process.

The acid solution used for the first wet process in step S12a is most preferably hydrochloric acid (HCl), but any other acid solutions other than this, such as phosphoric acid ($H_3PO_4$), formic acid (HCOOH), acetic acid ($CH_3COOH$), oxalic acid (($COOH)_2$), or carbonic acid ($H_2CO_3$, or $CO_2+H_2O$), can be used instead.

Then, in a second wet process in step S12b, the semiconductor substrate 1 is subjected to a wet treatment (cleaning process) with an alkaline solution. The alkaline solution used for the second wet process in step S12b is most preferably ammonia ($NH_3$), but any other alkaline solutions other than this, such as tetramethylammonium hydroxide (TMAH), dimethylamine, monoethanol amine, diethanolamine, triethanolamine, or ethylhydroxylamine ($C_2H_5ONH_2$), can be used.

Then, in a third wet process in step S12c, the semiconductor substrate 1 is subjected to a wet treatment (wet etching process) with an acid solution (second acid solution) containing hydrofluoric acid.

The acid solution used for the third wet process in step S12c contains at least hydrofluoric acid (HF), and more preferably further contains hydrochloric acid (HCl) in addition to the hydrofluoric acid.

Accordingly, the acid solution used for the first wet process in step S12a is most preferably a hydrochloric acid (HCl) aqueous solution (hydrochloric acid diluted with water, that is, diluted hydrochloric acid). The alkaline solution used for the second wet process in step S12b is most preferably an ammonia aqueous solution (aqueous ammonia). The acid solution used for the third wet process in step S12c is most preferably an aqueous solution of hydrofluoric acid (HF) and hydrochloric acid (HCl).

One example of preferable conditions for the first, second, and third wet processes in steps S12a, S12b, and S12c can be as follows. That is, the first wet process can be performed in step S12a for about 60 seconds using, for example, a HCl (hydrochloric acid) aqueous solution (diluted hydrochloric acid) having a concentration of about 0.0418 mol %. The second wet process can be performed in step S12b for about 180 seconds using, for example, a $NH_3$ (ammonia) aqueous solution (aqueous ammonia) having a concentration of about 0.0561 mol %. The third wet process can be performed in step S12c for about 60 seconds using, for example, an aqueous solution of HCl (hydrochloric acid) having a concentration of about 0.411 mol %, and HF (hydrofluoric acid) having a concentration of about 0.0106 mol %. The process temperature of the first, second, and third wet processes in steps S12a, S12b, and S12c (the temperature of the acid solution or alkaline solution used) can be, for example, room temperature (of about 15 to 25° C.).

Either the first wet process in step S12a or the second wet process in step S12b may be performed first. In contrast, the third wet process in step S12c should be performed after both the first wet process in step S12a and the second wet process in step S12b.

The first wet process in step S12a, the second wet process in step S12b, and the third wet process in step S12c can be performed by bringing the acid solution or alkali solution for use in each wet process into contact with the main surface of the semiconductor substrate 1 (main surface on the formation side of the Hf-containing insulating films 4a and 4b and of the gate electrodes GE1 and GE2). For example, the wet process in each of steps S12a, S12b, and S12c can be performed by immersing the semiconductor substrate 1 in the acid solution or alkali solution for use in the wet process, or by supplying the acid solution or alkali solution for use in the wet process to the main surface of the semiconductor substrate 1 (main surface on the formation side of the Hf-containing insulating films 4a and 4b and of the gate electrodes GE1 and GE2), while rotating the semiconductor substrate 1.

Figure 13:
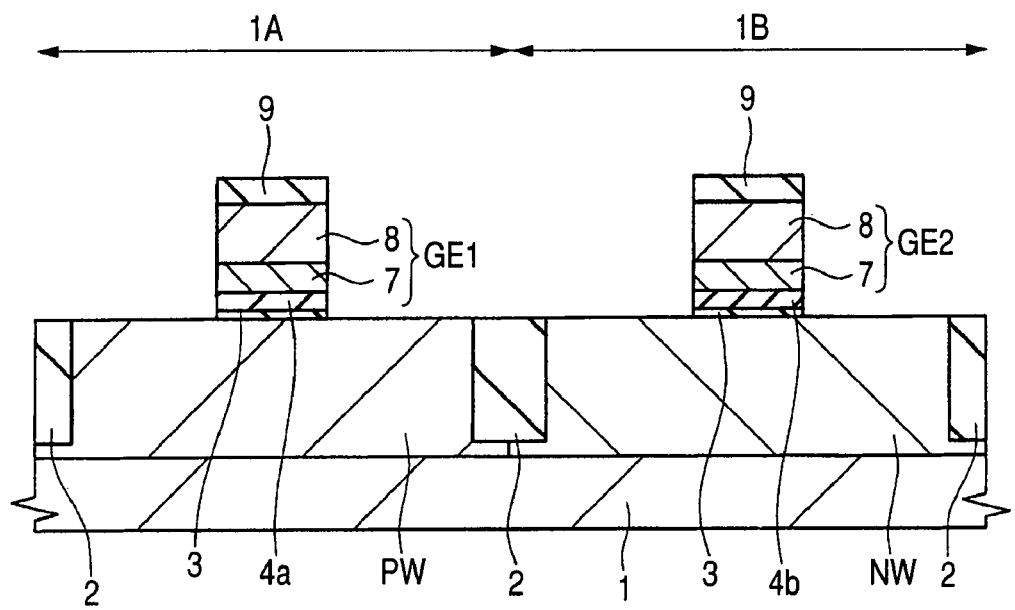
FIG. 13 is a cross-sectional view of a main part of the semiconductor device in a manufacturing step following the step shown in FIG. 12.

As shown in FIG. 13, such wet etching in step S12 (that is, the wet processes in steps S12a, S12b, and S12c) removes the part of the Hf-containing insulating film 4a not covered with the gate electrode GE1 and the part of the Hf-containing insulating film 4b not covered with the gate electrode GE2. In contrast, the Hf-containing insulating film 4a positioned below the gate electrode GE1, and the Hf-containing insulating film 4b positioned below the gate electrode GE2 remain without being removed by the dry etching in step S11 and by the wet etching in step S12 to become the high dielectric constant gate insulators. The respective roles played by the first wet process in step S12a, the second wet process in step S12b, and the third wet process in step S12c will be described in more detail below. In a case where the interface layer 3 is formed in the above step S4, the wet etching in step S12 removes the parts of the Hf-containing insulating films 4a and 4b not covered with the gate electrodes GE1 and GE2, and also removes the part of the interface layer 3 not covered with the gate electrode GE1 in the nMIS formation region 1A and the part of the interface layer 3 not covered with the gate electrode GE2 in the pMIS formation region 1B.

Figure 14:
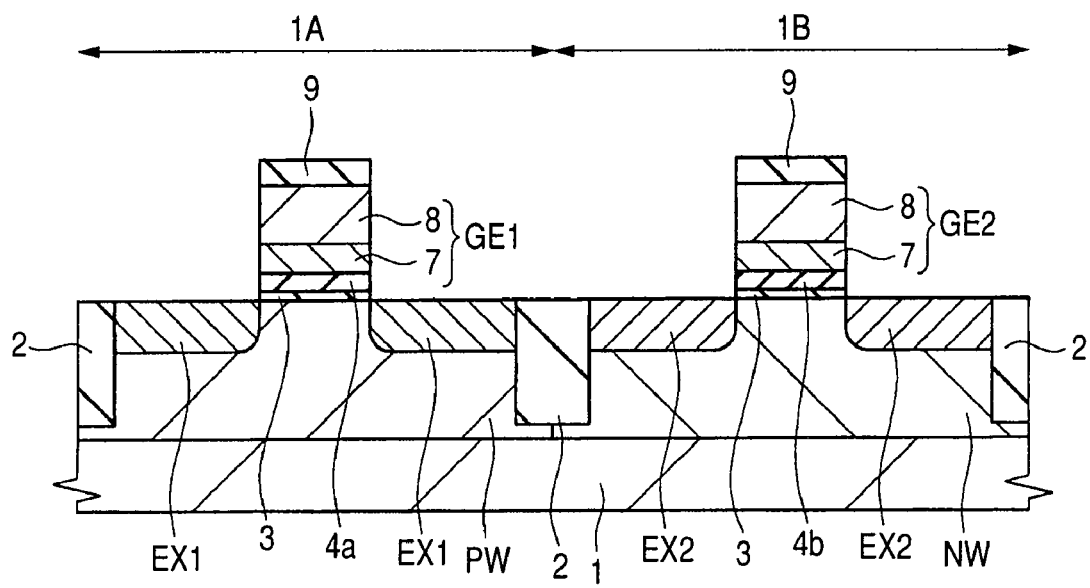
FIG. 14 is a cross-sectional view of a main part of the semiconductor device in a manufacturing step following the step shown in FIG. 13.

Then, as shown in FIG. 14, n-type impurities, such as phosphorus (P) or arsenic (As), are ion-implanted into both sides of the gate electrode GE1 of the p-type well PW in the nMIS formation region 1A to thereby form the $n^-$-type semiconductor regions EX1s. And, p-type impurities, such as boron (B), are ion-implanted into both sides of the gate electrode GE2 of the n-type well NW in the pMIS formation region 1B to thereby form the $p^-$-type semiconductor regions EX2s (in step S13 of FIG. 2). At the time of the ion implantation for formation of the $n^-$-type semiconductor region EX1, the pMIS formation region 1B is covered with a photoresist film (not shown) serving as an ion implantation interrupting mask, and then the ion implantation is performed over the semiconductor substrate 1 (p-type well PW) in the nMIS formation region 1A using the gate electrode GE1 (or the insulating film 9 thereon) as a mask. At the time of the ion implantation for formation of the $p^-$-type semiconductor region EX2, the nMIS formation region 1A is covered with another photoresist film (not shown) serving as an ion implantation interrupting mask, and then the ion implantation is performed over the semiconductor substrate 1 (n-type well NW) in the pMIS formation region 1B using the gate electrode GE2 (or the insulating film 9 thereon) as a mask. Either the $n^-$-type semiconductor region EX1 or the $p^-$-type semiconductor region EX2 may be formed first.

Figure 15:
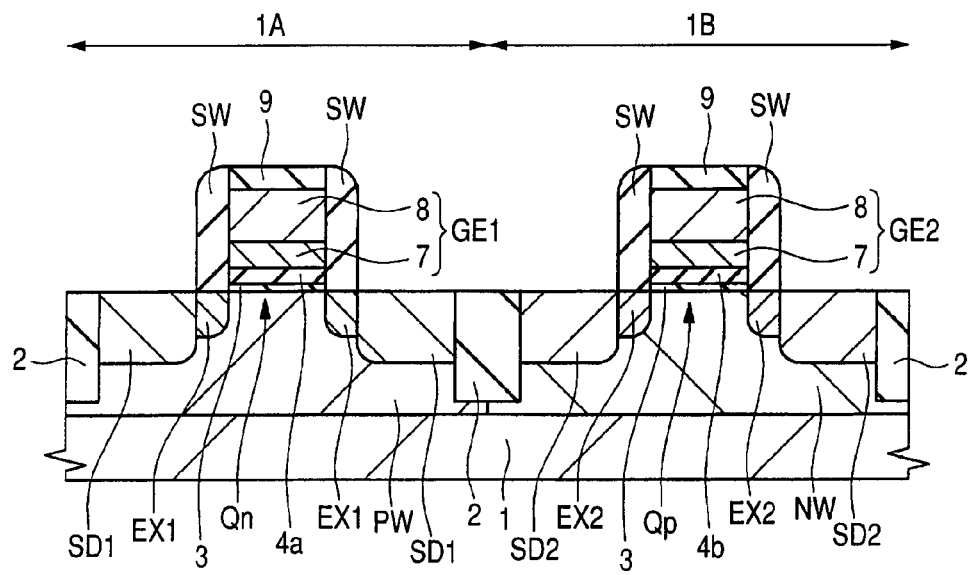
FIG. 15 is a cross-sectional view of a main part of the semiconductor device in a manufacturing step following the step shown in FIG. 14.

Then, as shown in FIG. 15, sidewalls (sidewall spacer, sidewall insulating film) SWs made of insulator are formed on side walls of the gate electrodes GE1 and GE2 (in step S14 of FIG. 2). For example, a silicon oxide film and a silicon nitride film are formed over the semiconductor substrate 1 in that order from the bottom so as to cover the gate electrodes GE1 and GE2. Then, the stacked film of the silicon oxide film and the silicon nitride film are subjected to anisotropic etching (etched back), which can form the sidewalls SWs comprised of the silicon oxide film and the silicon nitride film and remaining on the side walls of the gate electrodes GE1 and GE2. For simplification of the drawings, FIG. 15 shows that the silicon oxide film and the silicon nitride film which form the sidewall SW are integral with each other.

Then, the $n^+$-type semiconductor region SD1 is formed in the p-type well PW of the nMIS formation region 1A by an ion implantation process, and the $p^+$-type semiconductor region SD2 is formed in the n-type well NW of the pMIS formation region 1B by another ion implantation process (in step S15 of FIG. 2).

The $n^+$-type semiconductor regions SD1s can be formed by ion-implanting n-type impurities, such as phosphorus (P) or arsenic (As), into both sides of the gate electrode GE1 and sidewalls SWs in the p-type well PW within the nMIS formation region 1A. The $n^+$-type semiconductor region SD1 has an impurity concentration higher than that of the $n^-$-type semiconductor region EX1, and a junction depth deeper than that of the region EX1. At the time of the ion implantation for formation of the $n^+$-type semiconductor region SD1, the pMIS formation region 1B is covered with a photoresist film (not shown) as an ion implantation interrupting mask, and then the ion implantation is performed into the semiconductor substrate 1 (p-type well PW) in the nMIS formation region 1A using the gate electrode GE1 (or the insulating film 9 thereon) and the sidewalls SWs on the side walls thereof as a mask. Thus, each $n^-$-type semiconductor region EX1 is formed in alignment with the gate electrode GE1, and each $n^+$-type semiconductor region SD1 is formed in alignment with the sidewall SW.

The $p^+$-type semiconductor regions SD2s can be formed by ion-implanting p-type impurities, such as boron (B), into both sides of the gate electrode GE2 and sidewalls SWs in the n-type well NW within the pMIS formation region 1B. The $p^+$-type semiconductor region SD2 has an impurity concentration higher than that of the $p^-$-type semiconductor region EX2, and a junction depth deeper than that of the region EX2. At the time of the ion implantation for formation of the $p^+$-type semiconductor region SD2, the nMIS formation region 1A is covered with another photoresist film (not shown) as another ion implantation interrupting mask, and then the ion implantation is performed into the semiconductor substrate 1 (n-type well NW) in the pMIS formation region 1B using the gate electrode GE2 (or the insulating film 9 thereon) and the sidewalls SWs on the side walls thereof as another mask. Thus, each $p^-$-type semiconductor region EX2 is formed in alignment with the gate electrode GE2, and each $p^+$-type semiconductor region SD2 is formed in alignment with the sidewall SW. Either the $n^+$-type semiconductor region SD1 or the $p^+$-type semiconductor region SD2 may be formed first.

The n-type impurities can also be introduced into the silicon film 8 included in the gate electrode GE1 of the nMIS formation region 1A during the ion implantation process for formation of the $n^-$-type semiconductor region EX1 or during the ion implantation process for formation of the $n^+$-type semiconductor region SD1. The p-type impurities can be introduced into the silicon film 8 included in the gate electrode GE2 of the pMIS formation region 1B during the ion implantation process for formation of the $p^-$-type semiconductor region EX2 or during the ion implantation process for formation of the $p^+$-type semiconductor region SD2.

The $n^+$-type semiconductor region SD1 serves as the source/drain region of the n-channel MISFET Qn, and the $p^+$-type semiconductor region SD2 serves as the source/drain region of the p-channel MISFET Qp. Thus, the process in step S15 can be regarded as a combination of the ion implantation for formation of the source and drain regions of the n-channel MISFET Qn and the ion implantation for formation of the source and drain regions of the p-channel MISFET Qp.

After the ion implantation for formation of the $n^+$-type semiconductor region SD1 and the ion implantation for formation of the p$^+$-type semiconductor region SD2 in step S15, heat treatment (annealing process, activation annealing) is performed so as to activate the introduced impurities (in step S16 of FIG. 2). The impurities introduced into the n$^-$-type semiconductor region EX1, the p$^-$-type semiconductor region EX2, the n$^+$-type semiconductor region SD1, the p$^+$-type semiconductor region SD2, and the silicon film 8 by the ion implantation in steps S13 and S15 can be activated by the heat treatment in step S16. The heat treatment in step S16 can be performed under an inert gas atmosphere, more preferably, under a nitrogen atmosphere, at a heat treatment temperature of, for example, 900 to 1300° C.

In this way, a structure shown in FIG. 15 is obtained in which the n-channel MISFET Qn is formed in the nMIS formation region 1A as a field-effect transistor, and the p-channel MISFET Qp is formed in the pMIS formation region 1B as another field-effect transistor.

The gate electrode GE1 serves as the gate electrode (metal gate electrode) of the n-channel MISFET Qn. The Hf-containing insulating film 4a (and the interface layer 3 under the film 4a) under the gate electrode GE1 serves as the gate insulator of the n-channel MISFET Qn. The n-type semiconductor region (impurity diffusion layer) serving as the source or drain of the n-channel MISFET Qn is formed of the n$^+$-type semiconductor region SD1 and the n$^-$-type semiconductor region EX1. The gate electrode GE2 serves as the gate electrode (metal gate electrode) of the p-channel MISFET Qp. The Hf-containing insulating film 4b (and the interface layer 3 under the film 4b) under the gate electrode GE2 serves as the gate insulator of the p-channel MISFET Qp. The p-type semiconductor region (impurity diffusion layer) serving as the source or drain of the p-channel MISFET Qp is formed of the p$^+$-type semiconductor region SD2 and the p$^-$-type semiconductor region EX2.

Figure 16:
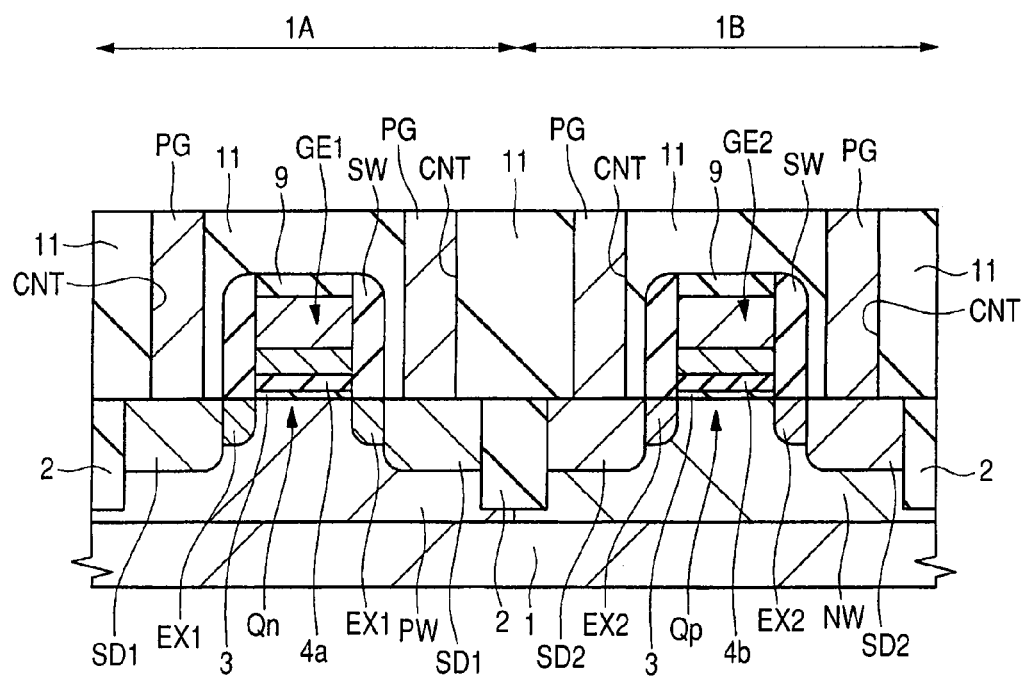
FIG. 16 is a cross-sectional view of a main part of the semiconductor device in a manufacturing step following the step shown in FIG. 15.

Then, as shown in FIG. 16, an insulting film (interlayer insulating film) 11 is formed over the main surface of the semiconductor substrate 1 so as to cover the gate electrodes GE1 and GE2 and the sidewalls SWs. The insulating film 11 is comprised of, for example, a single film formed of a silicon oxide film, or a stacked film of a thin silicon nitride film and a thick silicon oxide film thereon. After formation of the insulating film 11, the insulating film 11 has its surface planarized by use of, for example, chemical mechanical polishing (CMP) method.

Then, the insulating film 11 is dry etched using a photoresist pattern (not shown) formed over the insulating film 11 as an etching mask to thereby form contact holes (through holes, or openings) in the insulating film 11. The contact holes CNTs are formed above the n$^+$-type semiconductor region SD1, the p$^+$-type semiconductor region SD2, and upper parts of the gate electrodes GE1 and GE2.

Then, conductive plugs (conductors for connection) PGs comprised of tungsten (W) or the like are formed in the contact holes CNTs. For example, in order to form the plugs PG, a barrier conductive film (for example, a titanium film, a titanium nitride film, or a stacked film thereof) is formed over the insulating film 11 including the insides (bottoms and side walls) of the contact holes CNTs. Then, a main conductive film comprised of a tungsten film or the like is formed over the barrier conductive film so as to fill the contact holes CNTs therewith. The unnecessary parts of the main conductive film and the barrier conductive film over the insulating film 11 can be removed by the CMP method, the etch back method, or the like to thereby form the plugs PGs. For simplification of the accompanying drawings, FIG. 16 shows the barrier conductive film and the main conductive film (tungsten film) included in the plug PG and integrated together.

Figure 17:
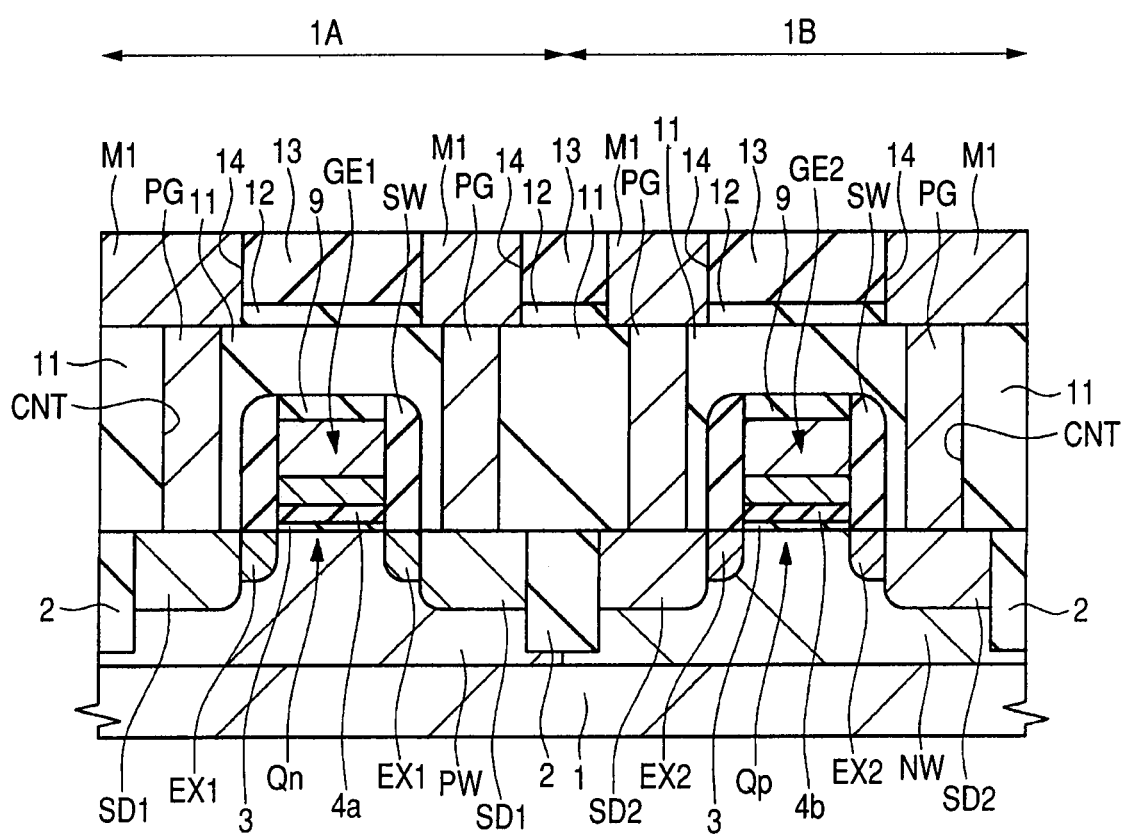
FIG. 17 is a cross-sectional view of a main part of the semiconductor device in a manufacturing step following the step shown in FIG. 16.

Then, as shown in FIG. 17, a stopper insulating film (insulating film for an etching stopper) 12 and an insulating film (interlayer insulating film) 13 for formation of wiring are formed in that order over the insulating film 11 with the plugs PGs embedded therein. The stopper insulating film 12 is a film serving as an etching stopper in processing trenches in the insulating film 13. The stopper insulating film 12 is made of material having etching selectivity to the insulating film 13. For example, the stopper insulating film 12 can be a silicon nitride film, and the insulating film 13 can be a silicon oxide film.

Then, a first layer wiring M1 is formed by a single damascene method. First, wiring trenches 14 are formed in predetermined areas of the insulating film 13 and the stopper insulating film 12 by dry etching using a photoresist pattern (not shown) as a mask. Then, a barrier conductive film (for example, a titanium nitride film, a tantalum film, or a tantalum nitride film, or the like) is formed over the main surface of the semiconductor substrate 1 (that is, over the insulating film 13 including the bottom and side walls of the wiring trench 14). Subsequently, a copper seed layer is formed over the barrier conductive film by the CVD, the sputtering method, or the like. Further, a copper plating film is formed over the seed layer by electrolytic plating or the like. The copper plating film fills the inside of the wiring trenches 14. Then, the copper plating film, the seed layer, and the barrier metal film positioned outside the wiring trenches 14 are removed by the CMP method, so that the first layer wiring M1 including copper as a principal conductive material is formed. For simplification of the accompanying drawings, FIG. 17 shows the copper plating film, seed layer, and barrier conductive film which are integrated together for formation of the wiring M1.

The wiring M1 is electrically coupled to the n$^+$-type semiconductor region SD1 and the p$^+$-type semiconductor region SD2 for the source or drain of the n-channel MISFET Qn and p-channel MISFET Qp via the plugs PGs. Thereafter, the second or later wirings are formed by the dual damascene method or the like. The illustration and description thereof will be omitted below. The wiring M1 and an upper layer wiring with respect to the wiring M1 are not limited to the damascene wiring, and hence can also be formed by patterning a conductive film for wiring, and can be, for example, a tungsten wiring, or an aluminum wiring.

Now, the features of this embodiment will be described in more detail below.

In this embodiment, the gate electrodes GE1 and GE2 of the n-channel MISFET Qn and the p-channel MISFET Qp each have the metal film 7 positioned over the gate insulator (corresponding to the interface layer 3 and the Hf-containing insulating films 4a and 4b), and are the so-called metal gate electrodes (metallic gate electrodes). Thus, the depletion of the gate electrode is suppressed, which can eliminate a parasitic capacity, thus reducing the size of the MISFET element (which can make the gate insulator thinner).

In this embodiment, the Hf-containing insulating film 4a having a dielectric constant higher than that of silicon oxide is used as the gate insulator of the n-channel MISFET Qn, and the Hf-containing insulating film 4b having a dielectric constant higher than that of silicon oxide is used as the gate insulator of the p-channel MISFET Qp. That is, each of the Hf-containing insulating films 4a and 4b is a film comprised of material having a dielectric constant (relative permittivity) higher than that of the silicon oxide, namely, the so-called High-k film (high dielectric constant film). The Hf-containing insulating films 4a and 4b are used as the gate insulators for the n-channel MISFET Qn and the p-channel MISFET Qp. Thus, in this case, the Hf-containing insulating film 4a and the Hf-containing insulating film 4b can have the physical thicknesses thereof increased as compared to the case of using a silicon oxide film as the gate insulator of the n-channel MISFET Qn and p-channel MISFET Qp, which can reduce leak current.

In this embodiment, lanthanum (La) is introduced into the Hf-containing insulating film 4a which is a high dielectric constant Hf-based gate insulator of the n-channel MISFET Qn. And, aluminum (Al) is introduced into the Hf-containing insulating film 4b which is a high dielectric constant Hf-based gate insulator of the p-channel MISFET Qp. Thus, the thresholds of both the n-channel MISFET Qn and the p-channel MISFET Qp can be lowered.

The Hf-based gate insulator, however, is generally difficult to etch. The inventors have found through studies that the introduction of La and Al into the Hf-based gate insulator can result in inconvenience caused by the etching of the Hf-based gate insulator in processing the gate.

Figure 18:
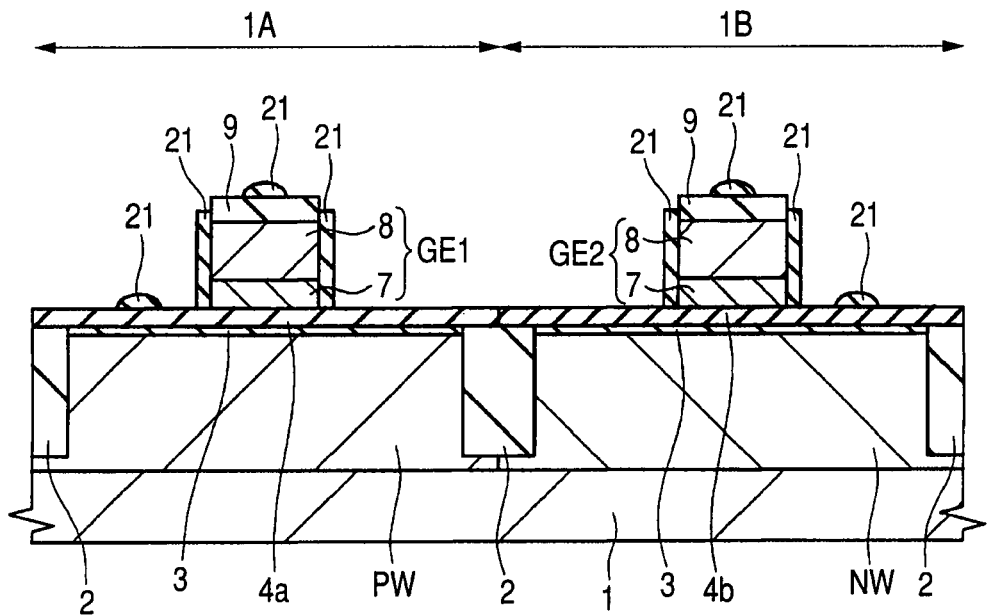
FIG. 18 is an explanatory diagram exemplarily showing the semiconductor device in a stage after a dry etching process in step S11.
Figure 19:
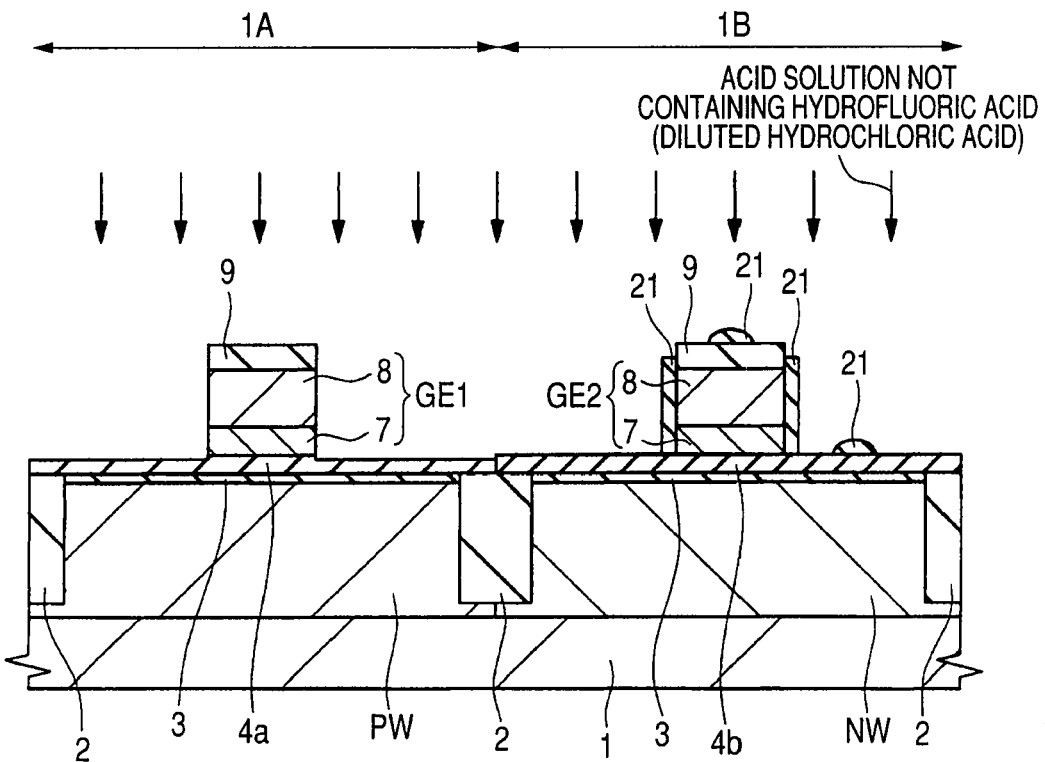
Figure 20:
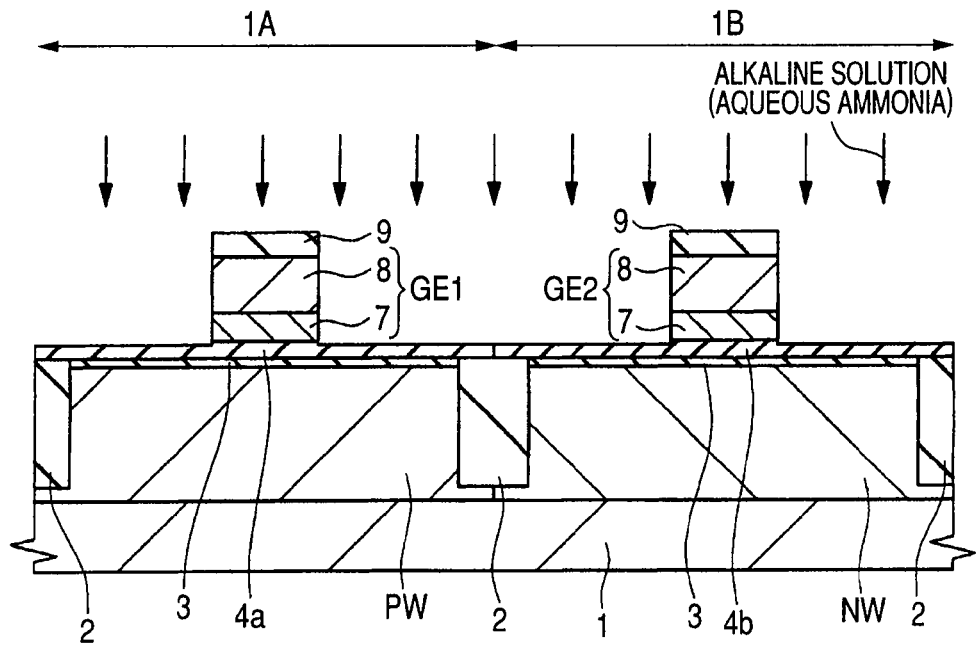
FIG. 20 is an explanatory diagram exemplarily showing the semiconductor device in a state of being subjected to a second wet process in step S12b.
Figure 21:
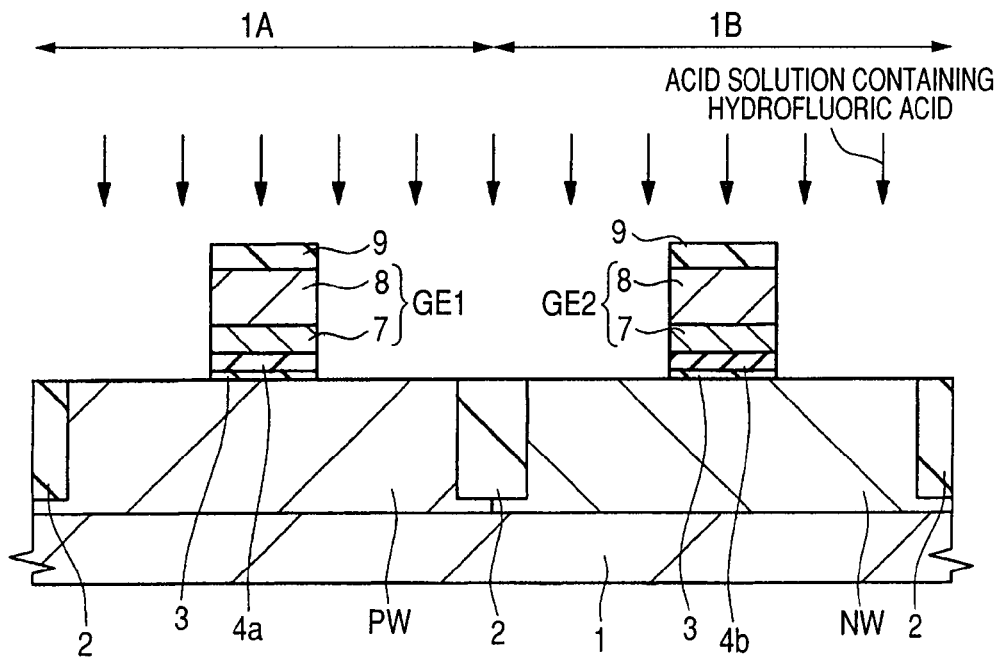
FIG. 21 is an explanatory diagram exemplarily showing the semiconductor device in a state of being subjected to a third wet process in step S12c.

In other words, after the dry etching process is completed in the case of processing (forming) the gate electrodes GE1 and GE2 by the dry etching in step S11, etching residues or deposited materials (reaction products, etched deposition materials) 21 generated by the dry etching may be attached to the main surface of the semiconductor substrate 1. The etching residues or deposited materials 21 are comprised of an element contained in the dry-etched silicon film 8, the metal film 7, or the Hf-containing insulating films 4a and 4b, or an element contained in an etching gas. FIG. 18 is an explanatory diagram (cross-sectional view) exemplarily showing a state in which the etching residues or deposited materials (reaction products) 21 generated by the dry etching are attached to the main surface of the semiconductor substrate 1 after the dry etching process in step S11, while showing the same area as that shown in FIG. 12. FIG. 19 is an explanatory diagram (cross-sectional view) exemplarily showing a state in which the first wet process is performed in step S12a after the dry etching in step S11. FIG. 20 is an explanatory diagram (cross-sectional view) exemplarily showing a state in which the second wet process is performed in step S12b after the first wet process in step S12a. FIG. 21 is an explanatory diagram (cross-sectional view) exemplarily showing a state in which the third wet process is performed in step S12c.

The dry etching process is performed in step S11 until the parts of the Hf-containing insulating films 4a and 4b not covered with the gate electrodes GE1 and GE2 are exposed to the outside, which can result in the deposited materials (reaction products) including La (lanthanum) contained in the Hf-containing insulating film 4a or Al (aluminum) contained in the Hf-containing insulating film 4b. Thus, as exemplarily shown in FIG. 18, the deposited materials (reaction products) 21 generated in the nMIS formation region 1A tend to contain La. In contrast, the deposited materials (reaction products) 21 generated in the pMIS formation region 1B tend to contain Al. La and Al tend to be bonded to fluorine in the hydrofluoric acid to form a fluoride. Thus, when the Hf-containing insulating films 4a and 4b with the deposited materials 21 left thereon are subjected to the wet etching using hydrofluoric acid, the La and Al contained in the deposited materials 21 will be bonded to the fluorine in the hydrofluoric acid to generate a La fluoride and an Al fluoride. The La fluoride and the Al fluoride, however, are difficult to dissolve in the hydrofluoric acid. Once the La fluoride or Al fluoride is generated, the La fluoride or Al fluoride may interrupt the etching of the Hf-containing insulating films 4a and 4b using the hydrofluoric acid, or may be left as foreign matter after the etching. As a result, the reliability of the manufactured semiconductor device can be reduced. Thus, when the Hf-containing insulating films 4a and 4b are subjected to wet etching, the formation of the La fluoride or Al fluoride is desired to be suppressed.

Accordingly, in this embodiment, the wet etching (that is, the third wet process in step S12c) with the acid solution containing hydrofluoric acid is not performed just after the dry etching in step S11. Before this wet etching, a cleaning process with an acid solution not containing hydrofluoric acid (that is, the first wet process in step S12a), and another cleaning process with an alkali solution (that is, the second wet process in step S12b) are performed.

As shown in FIGS. 19 and 20, the first wet process in step S12a and the second wet process in the above step S12b clean (cleanse) the main surface of the semiconductor substrate 1 (that is, the sides of the gate electrodes GE1 and GE2, the surfaces of the parts of the Hf-containing insulating films 4a and 4b not covered with the gate electrodes GE1 and GE2, and the like), whereby the deposited materials (reaction products) 21 attached to the main surface of the semiconductor substrate 1 can be removed. The acid solution used for the first wet process in step S12a does not contain hydrofluoric acid, and the alkaline solution used for the second wet process in step S12b does not also contain hydrofluoric acid. The first wet process in step S12a and the second wet process in step S12b can prevent the formation of the La fluoride or Al fluoride. That is, the first wet process in step S12a and the second wet process in step S12b can remove the deposited materials (reaction products) 21 by cleaning the main surface of the semiconductor substrate 1, while preventing the formation of the La fluoride or Al fluoride.

The reason for performing both the first wet process in step S12a and the second wet process in step S12b will be described below.

The Al can be removed by being reacted with or dissolved in the alkaline solution for use in the second wet process in step S12b, while La can hardly be removed by the alkaline solution for use in the second wet process in step S12b. In contrast, although the La and Al can be reacted with or dissolved in the acid solution for use in the first wet process in step S12a, the La is easily removed by the acid solution as compared to Al (in other words, Al is difficult to remove by the acid solution as compared to the La) because of difference in reactivity or solubility in such an acid solution between La and Al. Thus, one element of La and Al that can be removed by the second wet process in step S12b (that is, cleaning process with the alkaline solution) is Al. Further, one element of La and Al that can be removed by the first wet process in step S12a (that is, cleaning process with the acid solution not containing the hydrofluoric acid) is La.

When the second wet process (cleaning process with the alkaline solution) is performed in the step S12b without performing the first wet process in step S12a (cleaning process with the acid solution not containing the hydrofluoric acid) unlike this embodiment, the deposited material containing Al among the above deposited materials 21 can be removed by the second wet process in step S12b. However, the deposited material containing La among the above deposited materials 21 cannot be removed.

On the other hand, when the first wet process (cleaning process with the acid solution not containing hydrofluoric acid) is performed in step S12a without performing the second wet process (cleaning process with the alkaline solution) in step S12b unlike this embodiment, the deposited material containing La among the above deposited materials 21 can be easily removed by the first wet process in step S12a. However, it is not easy to sufficiently remove the deposited material containing Al among the above deposited materials 21.

When the deposited material 21 containing Al is intended to be removed only by the first wet process in step S12a without performing the second wet process in step S12b, the process time of the first wet process in step S12a (cleaning process with the acid solution not containing the hydrofluoric acid) needs to be increased. Alternatively, the concentration of the acid solution used (for example, the concentration of hydrochloric acid) needs to be increased. If the process time of the first wet process in step S12a is made longer, or if the concentration of the acid solution used (for example, the concentration of hydrochloric acid) is increased, side etching of the silicon film 8 or the metal film 7 (the phenomenon of etching of the silicon film 8 or metal film 7 from its side) can be promoted.

In contrast, in this embodiment, both the first wet process in step S12a and the second wet process in step S12b are performed to enable the accurate removal of both deposited materials 21 containing La and Al. In other words, the deposited materials containing La among the deposited materials 21 can be removed by the first wet process in step S12a as exemplarily shown in FIG. 19. The deposited materials containing Al among the deposited materials 21 can be removed by the second wet process in step S12b as exemplarily shown in FIG. 20 even when they cannot be completely removed by the first wet process in step S12a.

In this embodiment, the deposited materials 21 containing Al that cannot be easily removed by the first wet process in step S12a can be removed not only by the first wet process in step S12a, but also by the second wet process in step S12b. Thus, as compared to the case without the second wet process in step S12b, this embodiment can reduce the process time of the first wet process in step S12a (cleaning process with the acid solution not containing hydrofluoric acid), or can decrease the concentration of the acid solution for use in the first wet process in step S12a (for example, the concentration of hydrochloric acid). That is, the process time and/or the concentration of the acid solution (for example, the concentration of the hydrochloric acid) in the first wet process in step S12a can be set to a degree required to remove the deposited materials 21 containing La (a level lower than that required to remove the deposited materials 21 containing Al). Thus, the side etching of the silicon film 8 and the metal film 7 in the first wet process (cleaning process with the acid solution not containing the hydrofluoric acid) in step S12a can be suppressed or prevented. The alkaline solution for use in the second wet process in step S12b does not perform side etching of the metal film 7. Thus, the side etching of the silicon film 8 and the metal film 7 can be prevented even when the second wet process is added in step S12b. This embodiment can suppress or prevent the side etching of the silicon film 8 and the metal film 7 to thereby improve the reliability and performance of the manufactured semiconductor device.

In this way, this embodiment performs both the first wet process in step S12a and the second wet process in step S12b, and then performs the third wet process with the acid solution containing hydrofluoric acid in step S12c. Thus, the third wet process can be performed in step S12c while both the deposited material containing La and the deposited material containing Al among the deposited materials 21 are removed. As exemplarily shown in FIG. 21, the parts of the Hf-containing insulating films 4a and 4b and the interface layer 3 not covered with the gate electrodes GE1 and GE2 are removed by etching in the third wet process at step S12c, whereby the silicon film of the semiconductor substrate 1 is exposed to the outside. Since the third wet process is performed in step S12c while the deposited materials 21 containing La and Al are removed, the Hf-containing insulating films 4a and 4b can be etched by the acid solution containing hydrofluoric acid, while suppressing the formation of the La fluoride and Al fluoride during the third wet process in step S12c. This arrangement can suppress or prevent the La fluoride and Al fluoride from interrupting the etching of the Hf-containing insulating films 4a and 4b, and also from remaining as foreign matter after the etching. Thus, the reliability of the manufactured semiconductor device can be improved.

The inventors have found through studies that the concentration distribution of La (lanthanum) in the Hf-containing insulating film 4a in the thickness direction has a higher concentration of La at a superficial part (upper layer part), and a lower concentration of La toward the interface layer 3. This is based on the following reason. The Hf-containing insulating film 4a is formed by reaction between the Hf-containing film 4 and the La-containing film 6 thereon. If the Hf-containing film 4 and the La-containing film 6 are completely mixed together in forming the Hf-containing insulating film 4a, the concentration distribution of La in the Hf-containing insulating film 4a in the thickness direction should become uniform. In fact, however, it is difficult to completely mix the Hf-containing-film 4 and the La-containing film 6. Thus, directly before the dry etching process in step S11, the concentration distribution of La in the Hf-containing insulating film 4a in the thickness direction is not made uniform, and becomes nonuniform while maintaining a composition distribution of the Hf-containing film 4 and the La-containing film 6 to some degree before the reaction. As described above, the concentration distribution of La (lanthanum) in the Hf-containing insulating film 4a in the thickness direction has the higher La concentration at the superficial part (upper layer part) and the lower La concentration toward the interface layer 3. For the same reason, the concentration distribution of Al (aluminum) in the Hf-containing insulating film 4b in the thickness direction has a higher Al concentration at the superficial part (upper layer part) and a lower Al concentration toward the interface layer 3. The term "thickness direction or film thickness direction" as used in the present application corresponds to the direction perpendicular to the main surface of the semiconductor substrate 1.

As mentioned above, the element of La and Al that can be removed by the second wet process in step S12b is Al, while the element of La and Al that is easily removed by the first wet process in step S12a is La.

When the second wet process (cleaning process with the alkaline solution) is performed in the step S12b without performing the first wet process (cleaning process with the acid solution not containing the hydrofluoric acid) in step S12a unlike this embodiment, the superficial part of the Hf-containing insulating film 4b (that is, the part having a high concentration of Al) can be removed. However, the superficial part of the Hf-containing insulating film 4a (that is, the part having a high concentration of La) cannot be removed.

In contrast, when the first wet process (cleaning process with the acid solution not containing the hydrofluoric acid) is performed in the step S12a without performing the second wet process (cleaning process with the alkaline solution) in step S12b unlike this embodiment, the superficial part of the Hf-containing insulating film 4a (that is, the part having a high concentration of La) can be removed. However, the superficial part of the Hf-containing insulating film 4b (that is, the part having a high concentration of Al) cannot be easily removed. When the superficial part of the Hf-containing insulating film 4b (that is, the part having the high concentration of Al) is intended to be removed only by the first wet process in step S12a without performing the second wet process in step S12b, the process time of the first wet process in step S12a (cleaning process with the acid solution not containing the hydrofluoric acid) needs to be increased, or the concentration of the acid solution used (for example, the concentration of hydrochloric acid) needs to be increased. If the process time of the first wet process in step S12a is made longer, or if the concentration of the acid solution used (for example, the concentration of hydrochloric acid) is increased, side etching of the silicon film 8 or the metal film 7 (the phenomenon of etching of the silicon film 8 or metal film 7 from its side) can be promoted.

On the contrary, in this embodiment, both the first wet process in step S12a and the second wet process in step S12b are performed to enable the accurate removal of both the superficial part of the Hf-containing insulating film 4a (that is, the part having the high concentration of La) and the superficial part of the Hf-containing insulating film 4b (that is, the part having the high concentration of Al). That is, the superficial part of the Hf-containing insulating film 4a (that is, the part having the high concentration of La) can be removed by the first wet process in step S12a, and the superficial part of the Hf-containing insulating film 4b (that is, the part having the high concentration of Al) can be removed by the second wet process in step S12b without being removed by the first wet process in step S12a.

In this embodiment, the superficial part of the Hf-containing insulating film 4a (that is, the part having the high concentration of La) can be removed by the first wet process in step S12a, and the superficial part of the Hf-containing insulating film 4b (that is, the part having the high concentration of Al) which is difficult to remove by only the first wet process in step S12a can be removed not only by the first wet process in step S12a, but also by the second wet process in step S12b. Thus, both the superficial part of the Hf-containing insulating film 4a (that is, the part having the high concentration of La) and the superficial part of the Hf-containing insulating film 4b (that is, the part having the high concentration of Al) can be removed without increasing the process time of the first wet process in step S12a and without increasing the concentration of the acid solution (for example, the concentration of hydrochloric acid). Accordingly, this embodiment can suppress or prevent the side etching of the silicon film 8 and the metal film 7 to thereby improve the reliability and performance of the manufactured semiconductor device.

In this way, this embodiment performs both the first wet process in step S12a and the second wet process in step S12b, and then performs the third wet process with the acid solution containing the hydrofluoric acid in step S12c. Thus, the third wet process can be performed in step S12c while removing both the part having the high La concentration and the part having the high Al concentration in the Hf-containing insulating films 4a and 4b (that is, the superficial parts of the Hf-containing insulating films 4a and 4b). As exemplarily shown in FIG. 21, the parts of the Hf-containing insulating films 4a and 4b and the interface layer 3 not covered with the gate electrodes GE1 and GE2 are removed by etching in the third wet process at step S12, whereby the silicon surface of the semiconductor substrate 1 is exposed to the outside. Since the third wet process is performed in step S12c while removing the parts of the Hf-containing insulating films 4a and 4b having the high concentrations of La and Al, the Hf-containing insulating films 4a and 4b can be etched by the acid solution containing hydrofluoric acid, while suppressing the formation of the La fluoride and Al fluoride during the third wet process in step S12c. This arrangement can suppress or prevent the La fluoride and Al fluoride from interrupting the etching of the Hf-containing insulating films 4a and 4b, and also from remaining as foreign matter after the etching. Thus, the reliability of the manufactured semiconductor device can be improved.

Thus, the deposited materials 21 containing La and the superficial part of the Hf-containing insulating film 4a not covered with the gate electrode GE1 in the nMIS formation region 1A are removed by the first wet process in step S12a. The deposited materials 21 containing Al and the superficial part of the Hf-containing insulating film 4b not covered with the gate electrode GE2 in the pMIS formation region 1B are removed by the second wet process in step S12b. Then, the remaining part of the Hf-containing insulating film 4a not covered with the gate electrode GE1 in the nMIS formation region 1A, and the remaining part of the Hf-containing insulating film 4b not covered with the gate electrode GE2 in the pMIS formation region 1B are removed by the third wet process in step S12c.

Thus, in this embodiment, both the first wet process (cleaning process) in step S12a and the second wet process (cleaning process) in step S12b are performed before the wet etching (that is, the third wet process in step S12c) with the acid solution containing the hydrofluoric acid, whereby the deposited materials 21 containing La or Al can be removed, and the parts of the Hf-containing insulating films 4a and 4b having the high concentrations of La and Al can also be removed. Thus, the Hf-containing insulating films 4a and 4b can be etched using the acid solution containing hydrofluoric acid by the third wet process in step S12c, while suppressing the formation of the La fluoride and Al fluoride, which can prevent the inconvenience caused by the La fluoride or Al fluoride to thereby improve the reliability of the manufactured semiconductor device.

This embodiment can etch and remove the parts of the Hf-containing insulating films 4a and 4b not covered with the gate electrodes GE1 and GE2 mainly by the third wet process using the acid solution containing the hydrofluoric acid in step S12c, which can reduce an etching time required to remove the parts of the Hf-containing insulating films 4a and 4b not covered with the gate electrodes GE1 and GE2. This arrangement can improve the reliability of the semiconductor device, reduce the manufacturing time of the semiconductor device, and also improve a throughput of the semiconductor device.

The second wet process in step S12b may be performed after the first wet process in step S12a. Alternatively, the first process in step S12a may be performed after the second wet process in step S12b. The important thing is that both the first wet process in step S12a and the second wet process in step S12b are performed after the dry etching process in step S11 and before the third wet process in step S12c. Thus, the first wet process in step S12a needs to be performed at least one time after the dry etching process in step S11 and before the third wet process in step S12c. When the first wet process is performed one time, the manufacturing process of the semiconductor device can be simplified (which can also reduce the manufacturing time of the semiconductor device). However, the first wet process can be performed a plurality of times so as to enhance the removing capability of the deposited materials 21 containing La and the like. Likewise, the second wet process in step S12b needs to be performed at least one time after the dry etching process in step S11 and before the third wet process in step S12c. When the second wet process is performed one time, the manufacturing process of the semiconductor device can be simplified (which can also reduce the manufacturing time of the semiconductor device). However, the first wet process can be performed a plurality of times so as to enhance the removing capability of the deposited materials 21 containing Al and the like. The first wet process in step S12a and the second wet process in step S12b can be alternately performed after the dry etching process in step S11 and before the third wet process in step S12c, which can enhance the removal capability of the deposited materials 21 containing La, or Al, and the like.

The deposited materials 21 containing La and the part of the Hf-containing insulating film 4a having the high concentration of La (that is, the superficial part of the Hf-containing insulating film 4a) are removed by the first wet process in step S12a, while preventing the formation of the La fluoride and Al fluoride. From this point, it is essential that the acid solution used in the first wet process at step S12a does not contain hydrofluoric acid. However, hydrochloric acid (more specifically, a hydrochloric acid aqueous solution) is most preferable. In addition to the hydrochloric acid, any other acid solutions, including phosphoric acid, formic acid, acetic acid, oxalic acid, or carbonic acid (more specifically, an aqueous solution of the above acid), can be used instead.

The use of sulfuric acid ($H_2SO_4$) for the first wet process in step S12a can form a passive film on the surfaces of the Hf-containing insulating films 4a and 4b. Thus, preferably, the acid solution used for the first wet process in step S12a does not contain sulfuric acid as well as hydrofluoric acid. That is, the first wet process in step S12a is preferably performed using the acid solution not containing hydrofluoric acid and sulfuric acid.

The deposited materials 21 containing Al and the part of the Hf-containing insulating film 4b having the high concentration of Al (that is, the superficial part of the Hf-containing insulating film 4b) are removed by the second wet process in step S12b, while preventing the formation of the La fluoride and Al fluoride. From this point, the alkaline solution used for the second wet process in step S12b is most preferably ammonia ($NH_3$) aqueous solution (that is, aqueous ammonia). Examples of usable alkaline solutions include, in addition to the ammonia aqueous solution, tetramethylammonium hydroxide, dimethylamine, monoethanolamine, diethanolamine, triethanolamine, and ethylhydroxylamine.

Thus, the first wet process in step S12a can more preferably use the acid solution containing hydrochloric acid without containing hydrofluoric acid and sulfuric acid, and most preferably a hydrochloric acid aqueous solution. The second wet process in step S12b can more preferably use the alkaline solution containing ammonia, and most preferably an ammonia aqueous solution (aqueous ammonia).

The third wet process in step S12c needs to completely remove the parts of the Hf-containing insulating films 4a and 4b not covered with the gate electrodes GE1 and GE2. Thus, the acid solution used for the third wet process in step S12c contains hydrofluoric acid, and further more preferably contains hydrochloric acid. Accordingly, the third wet process most preferably uses an aqueous solution of the hydrofluoric acid and hydrochloric acid.

The parts of the Hf-containing insulating films 4a and 4b not covered with the gate electrodes GE1 and GE2 are removed mainly by the third wet process in step S12c, and the interface layer 3 is also removed by the third wet process in step S12c. The third wet process in step S12c can be regarded as the wet etching process. The deposited materials 21 are removed mainly by the first wet process in step S12a and the second wet process in step S12b. The first wet process in step S12a and the second wet process in step S12b can be regarded as the cleaning process. Since the superficial parts of the Hf-containing insulating films 4a and 4b (parts having the high concentration of La or Al) can be removed by the first wet process in step S12a and the second wet process in step S12b, the first wet process in step S12a and the second wet process in step S12b also serve as the wet etching process, in addition to the cleaning process. The amount of etching of the Hf-containing insulating films 4a and 4b (the thickness of the etched part) in the third wet process at step S12c is preferably larger (thicker) than that in each of the first wet process in step S12a and the second wet process in step S12b.

Second Embodiment

Figure 22:
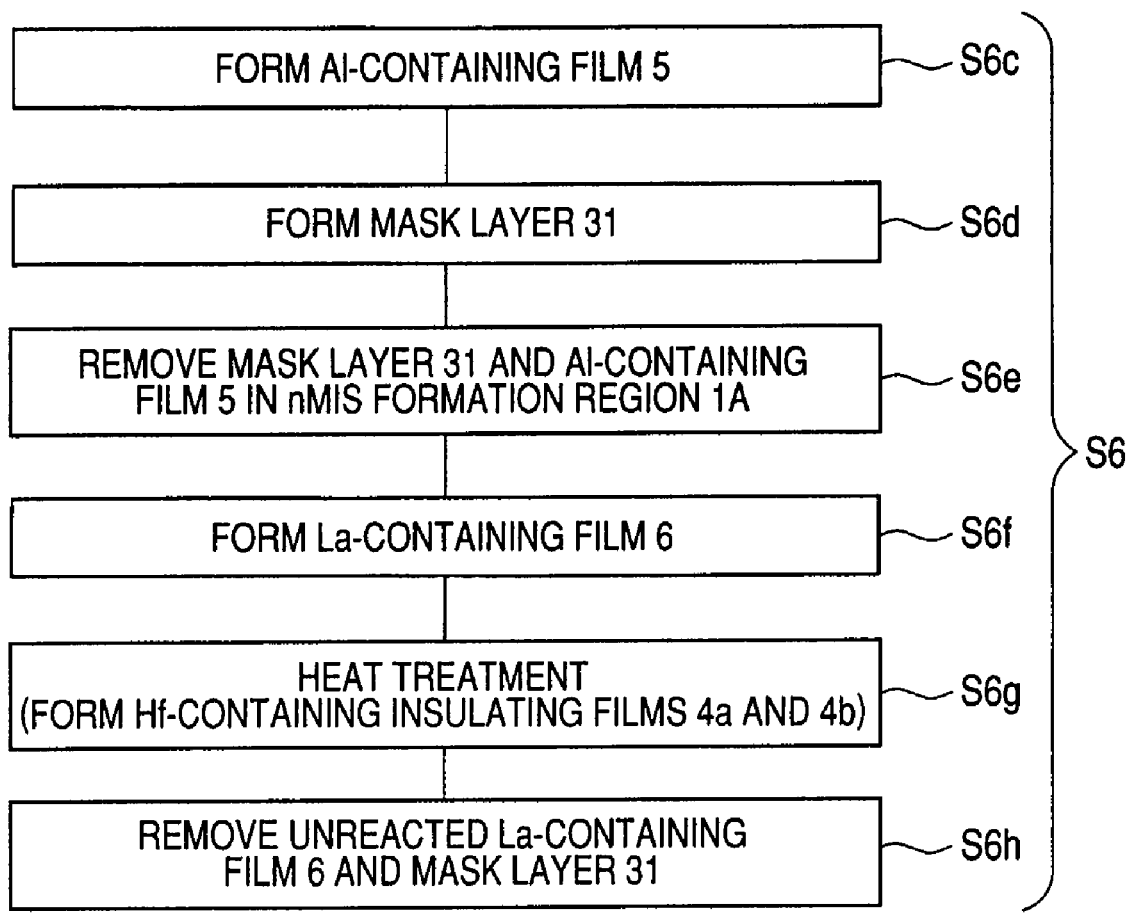
FIG. 22 is a manufacturing process flowchart showing another example of a process in step S6 of FIG. 2.

This embodiment will describe another example of a process in the above step S6 (formation process of the Hf-containing insulating films 4a and 4b). FIG. 22 is a manufacturing process flowchart showing another example (that is, the second embodiment) of the process in step S6 (formation process of the Hf-containing insulating films 4a and 4b). FIG. 22 corresponds to FIG. 3 of the first embodiment. Each of FIGS. 23 to 28 is a cross-sectional view of a main part of the semiconductor device in a manufacturing step according to another embodiment of the invention.

The manufacturing process of this embodiment is the same as that of the first embodiment until the formation of the Hf-containing film 4 in step S5, and thus a description thereof will be omitted below. Now, the following steps after the formation of the Hf-containing film 4 in step S5 will be described below.

Figure 23:
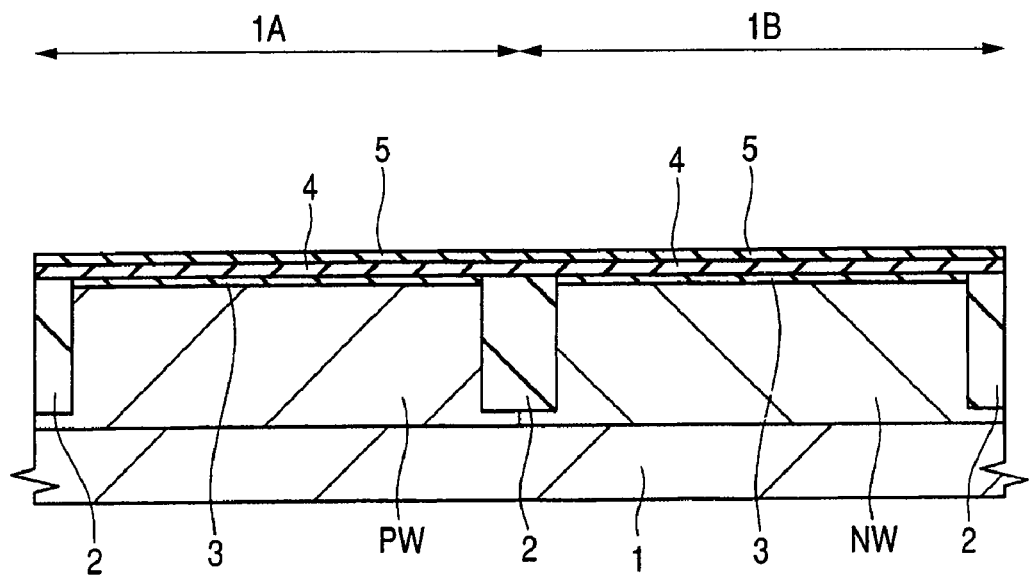
FIG. 23 is a cross-sectional view of a main part of the semiconductor device in a manufacturing step according to another embodiment of the invention.

After obtaining the structure shown in FIG. 7 by performing the same processes as those in steps S1 to S5 of the first embodiment, in this embodiment, as shown in FIG. 23, an Al-containing film 5 is formed over the main surface of the semiconductor substrate 1, that is, over the Hf-containing film 4 (in step S6c of FIG. 22). In step S6c, the Al-containing film 5 is formed over the entire main surface of the semiconductor substrate 1, and thus formed over the Hf-containing film 4 in the nMIS formation region 1A and the pMIS formation region 1B. The material, thickness, and formation method of the Al-containing film 5 are the same as those of the first embodiment, and thus a description thereof will be omitted below.

Figure 24:
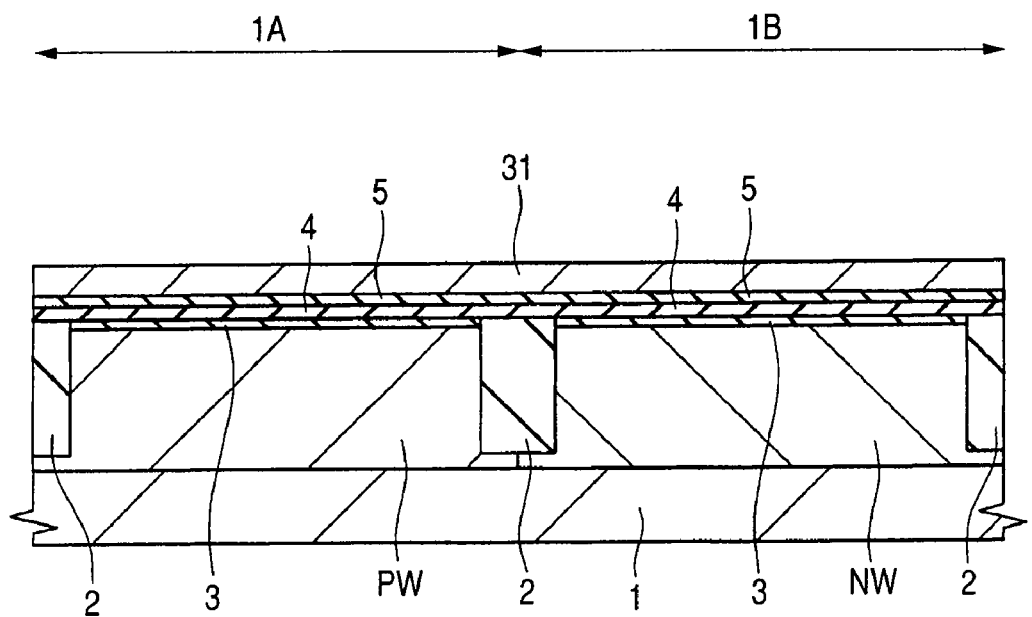
FIG. 24 is a cross-sectional view of a main part of the semiconductor device in a manufacturing step following the step shown in FIG. 23.

Then, as shown in FIG. 24, a mask layer 31 is formed over the main surface of the semiconductor substrate 1, that is, over the Al-containing film 5 (in step S6d of FIG. 22). The mask layer 31 is provided for preventing reaction between the Hf-containing film 4 or Al-containing film 5 in the p-MIS formation region 1B and the La-containing film 6 to be formed later. Taking into consideration such a function of preventing the reaction, the mask layer 31 is preferably a metal nitride film or metal carbide film, and more preferably a titanium nitride (TiN) film. The mask layer 31 can be formed using sputtering or the like, and can have a thickness of, for example, about 5 to 20 nm. The mask layer 31 is formed over the entire main surface of the semiconductor substrate 1 in step S6d, and thus formed over the Al-containing film 5 in the nMIS formation region 1A and the pMIS formation region 1B.

Figure 25:
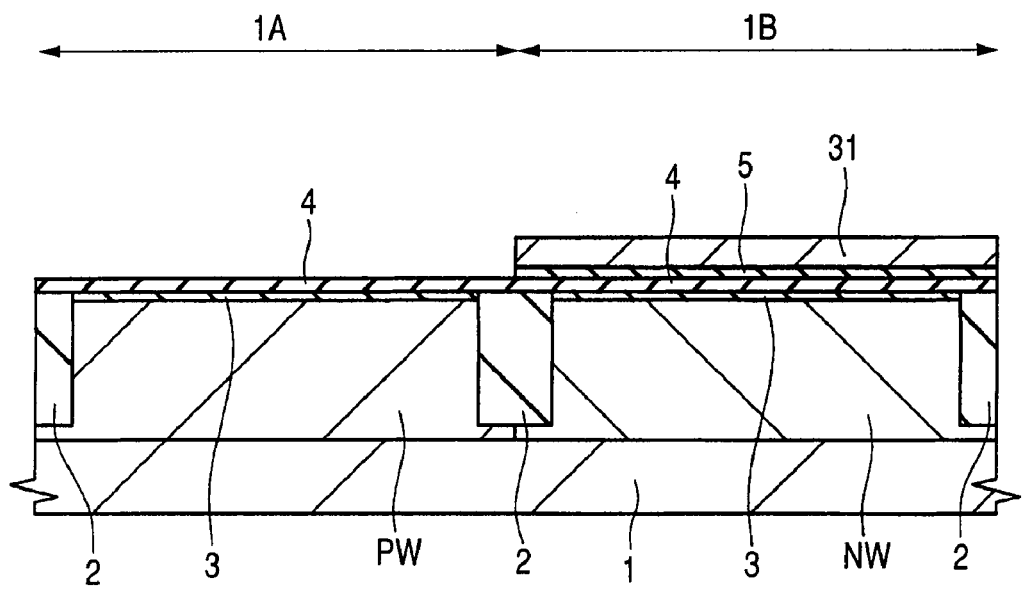
FIG. 25 is a cross-sectional view of a main part of the semiconductor device in a manufacturing step following the step shown in FIG. 24.

Then, as shown in FIG. 25, the mask layer 31 and the Al-containing film 5 in the nMIS formation region 1A are selectively removed by etching (preferably, wet etching, or a combination of dry etching and wet etching) to leave the mask layer 31 and the Al-containing film 5 in the pMIS formation region 1B (in step S6e of FIG. 22). As a result, in the nMIS formation region 1A, the Hf-containing film 4 is exposed, while in the pMIS formation region 1B, the Al-containing film 5 and the mask layer 31 thereon are formed and maintained over the Hf-containing film 4.

Specifically, in step S6e, a photoresist pattern (not shown) is formed on the mask layer 31 so as to cover the pMIS formation region 1B and to expose the nMIS formation region 1A. By using the photoresist pattern as an etching mask, the mask layer 31 in the nMIS formation region 1A is removed by etching, and subsequently the Al-containing film 5 in the nMIS formation region 1A is also removed by etching. Thereafter, the photoresist pattern is removed.

Figure 26:
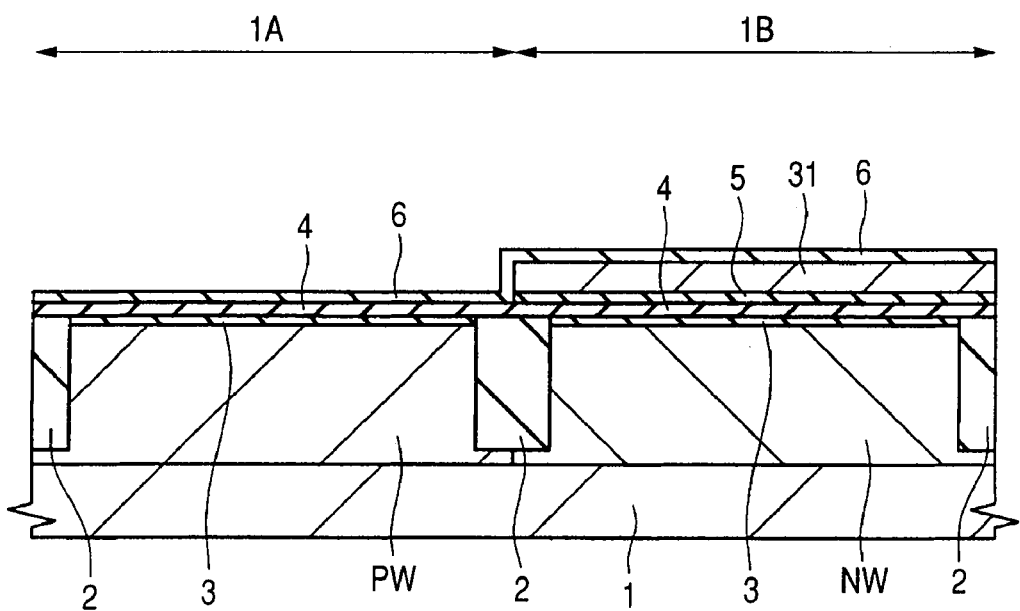
FIG. 26 is a cross-sectional view of a main part of the semiconductor device in a manufacturing step following the step shown in FIG. 25.

Then, as shown in FIG. 26, a La-containing film 6 is formed over the main surface of the semiconductor substrate 1 (in step S6f of FIG. 22).

In the etching process at step S6e, the mask layer 31 and the Al-containing film 5 in the nMIS formation region 1A are removed, and the mask layer 31 and the Al-containing film 5 in the pMIS formation region 1B are left. Then, in step S6f, the La-containing film 6 is formed on the Hf-containing film 4 in the nMIS formation region 1A, and formed on the mask layer 31 in the pMIS formation region 1B. Thus, in the nMIS formation region 1A, the La-containing film 6 is in contact with the Hf-containing film 4, and in the pMIS formation region 1B, the La-containing film 6 is not in contact with the Al-containing film 5 (and the Hf-containing film 4) because the mask layer 31 intervenes therebetween. The material, thickness, and formation method of the La-containing film 6 are the same as those of the first embodiment, and thus a description thereof will be omitted below.

Then, heat treatment is applied to the semiconductor substrate 1 (in step S6g of FIG. 22). The heat treatment process in step S6g can be performed at a heat treatment temperature preferably in a range of 600 to 1000° C. under an inert gas atmosphere (which may be a nitrogen gas atmosphere).

Figure 27:
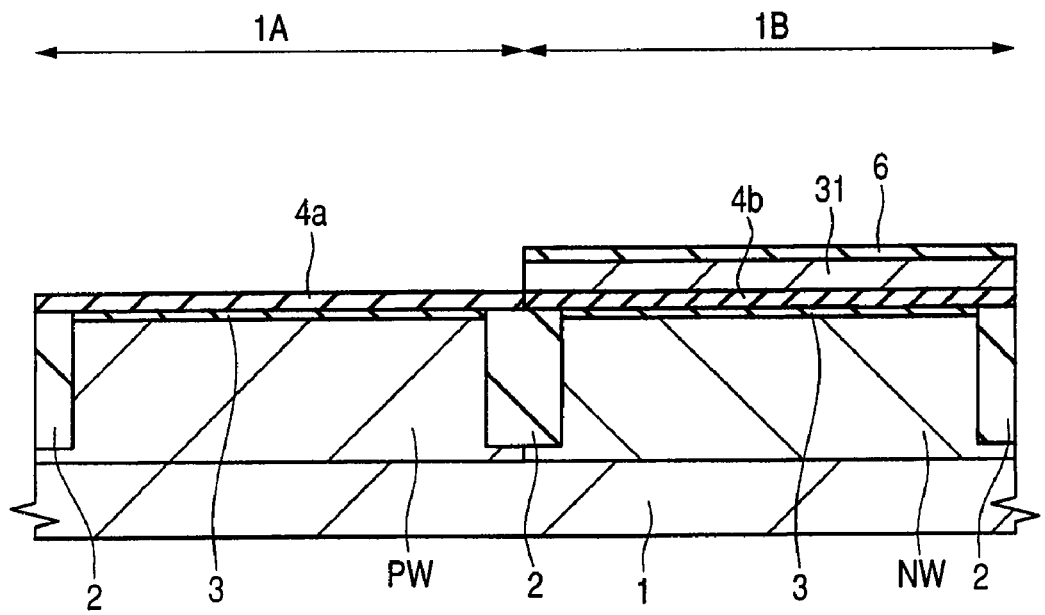
FIG. 27 is a cross-sectional view of a main part of the semiconductor device in a manufacturing step following the step shown in FIG. 26.

In the heat treatment at step S6g, the Hf-containing film 4 reacts (mixes, or interdiffuses) with the La-containing film 6 in the nMIS formation region 1A to form the Hf-containing insulating film 4a which is a reaction layer (mixed layer) between the Hf-containing film 4 and the La-containing film 6 as shown in FIG. 27. In the heat treatment at step S6g, the Hf-containing film 4 reacts (mixes, or interdiffuses) with the Al-containing film 5 in the pMIS formation region 1B to form the Hf-containing insulating film 4b which is a reaction layer (mixed layer, or mixing layer) between the Hf-containing film 4 and the Al-containing film 5 as shown in FIG. 27.

The Hf-containing insulating film 4a formed in the nMIS formation region 1A and the Hf-containing insulating film 4b formed in the pMIS formation region 1B by the heat treatment in step S6g are the same as the Hf-containing insulating film 4a formed in the nMIS formation region 1A and the Hf-containing insulating film 4b formed in the pMIS formation region 1B by the heat treatment in step S6b of the first embodiment. Thus, a description thereof will be omitted below.

The La-containing film 6 is formed over the mask layer 31 in the pMIS formation region 1B. The La-containing film 6 in the pMIS formation region 1B hardly reacts with the mask layer 31 and is left. That is, a suitable material selected for the mask layer 31 is one material which is stable even at the heat treatment temperature of the heat treatment process in step S6g, and which hardly reacts with any one of the Hf-containing film 4, the Al-containing film 5, and the La-containing film 6. As such a material, metal nitride, metal carbide, and the like are preferable, and specifically, titanium nitride (TiN) is most preferable.

In a case where the interface layer 3 is formed in step S4 before forming the Hf-containing film 4 in step S5, the silicon oxide film or silicon oxynitride film is preferably left as the interface layer 3 by suppressing the reaction between the Hf-containing film 4 and the lower interface layer 3 in the heat treatment at step S6g. This arrangement can manufacture a good device which suppresses degradation in driving force and reliability of the device.

Figure 28:
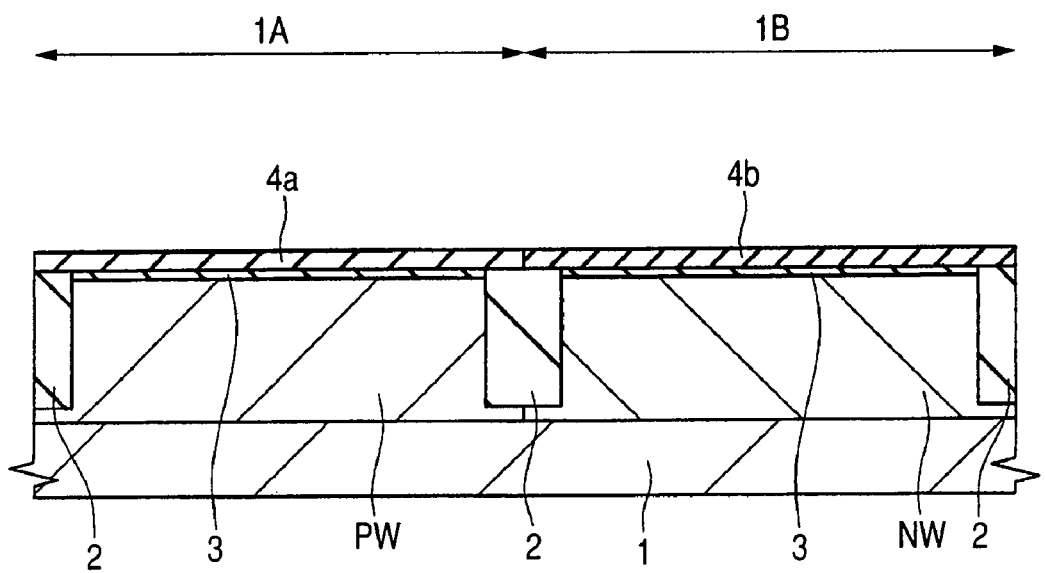
FIG. 28 is a cross-sectional view of a main part of the semiconductor device in a manufacturing step following the step shown in FIG. 27.

As shown in FIG. 28, after the heat treatment in step S6g, the La-containing film 6 (unreacted La-containing film 6, in particular, La-containing film 6 remaining on the mask layer 31) is removed by etching (preferably wet etching) after the heat treatment in step S6g. Then, the mask layer 31 is removed by etching (preferably wet etching) (in step S6h of FIG. 22). An unreacted part of the Al-containing film 5 (part not reacted by the heat treatment in step S6g) can be removed together with the mask layer 31 in removing the mask layer 31 in step S6h. Thus, the Hf-containing insulating film 4a is exposed to the outside in the nMIS formation region 1A, and the Hf-containing insulating film 4b in the pMIS formation 1B is exposed. FIG. 28 corresponds to the above FIG. 9.

Preferable conditions of the removing process for removing the mask layer 31 and the unreacted La-containing film 6 in step 6h (in particular, La-containing film 6 remaining on the mask layer 31) can be set by way of example as follows. That is, in step S6h, the removing process of the unreacted La-containing film 6 (in particular, the La-containing film 6 remaining over the mask layer 31) can be performed, for example, for about 30 seconds using a HCL aqueous solution (hydrochloric acid) whose concentration of the HCL solution is about 0.0418 mol/% (diluted hydrochloric acid). In step S6h, the removing process of the mask layer 31 can be performed in step S6h, for example, for about 30 minutes using an aqueous solution of a HCL (hydrochloric acid) having a concentration of HCL (hydrochloric acid) of about 0.0223 mol %, and a $H_2O_2$ (hydrogen peroxide) having a $H_2O_2$ concentration of about 19.2 mol %.

The following processes of this embodiment are the same as those of the first embodiment, and thus an illustration and description thereof will be omitted below. That is, the formation process of the metal film 7 in step S7 and the following steps are performed in the same way as the first embodiment.

This embodiment has described the manufacturing process performed for preventing the reaction between the Hf-containing film 4 and the La-containing film 6 in the pMIS formation region 1B by providing the mask layer 31 in the pMIS formation region 1B (that is, manufacturing steps explained with reference to FIGS. 23 to 28). In another embodiment (modified example), the mask layer 31 is provided in the nMIS formation region 1A, whereby the reaction between the Hf-containing film 4 and the Al-containing film 5 in the nMIS formation region 1A can be prevented. Manufacturing steps in such a case will be described below with reference to FIGS. 29 to 34. Different points from the manufacturing steps explained referring to FIGS. 23 to 28 will be mainly described below. Each of FIGS. 29 to 34 is a cross-sectional view of a main part of the semiconductor device according to this embodiment.

Figure 29:
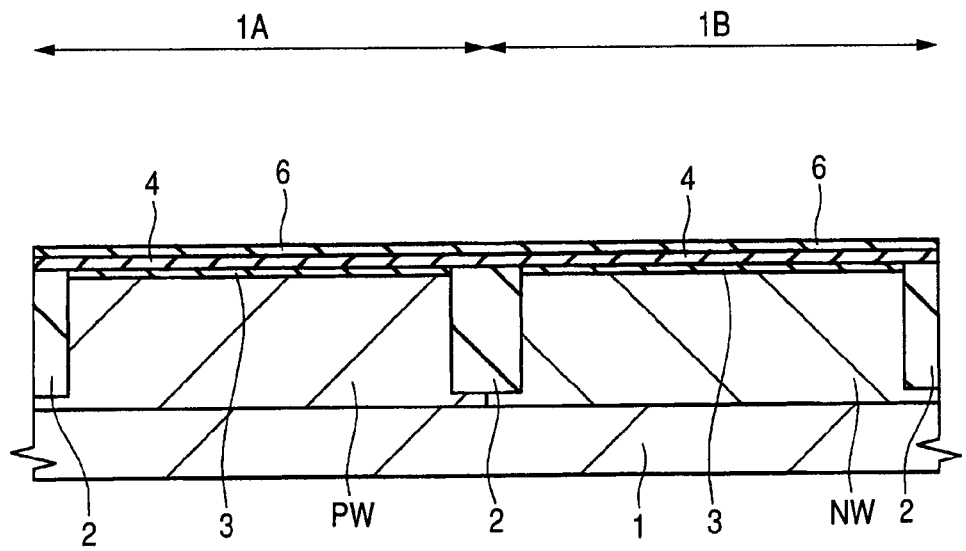
FIG. 29 is a cross-sectional view of a main part of a semiconductor device in another manufacturing step according to a further embodiment of the invention.
Figure 30:
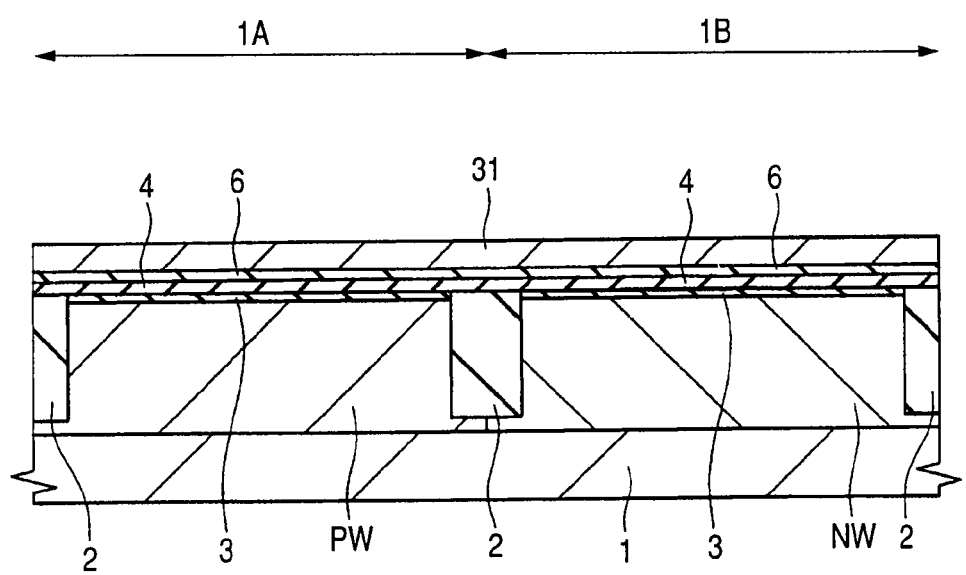
FIG. 30 is a cross-sectional view of a main part of the semiconductor device in a manufacturing step following the step shown in FIG. 29.
Figure 31:
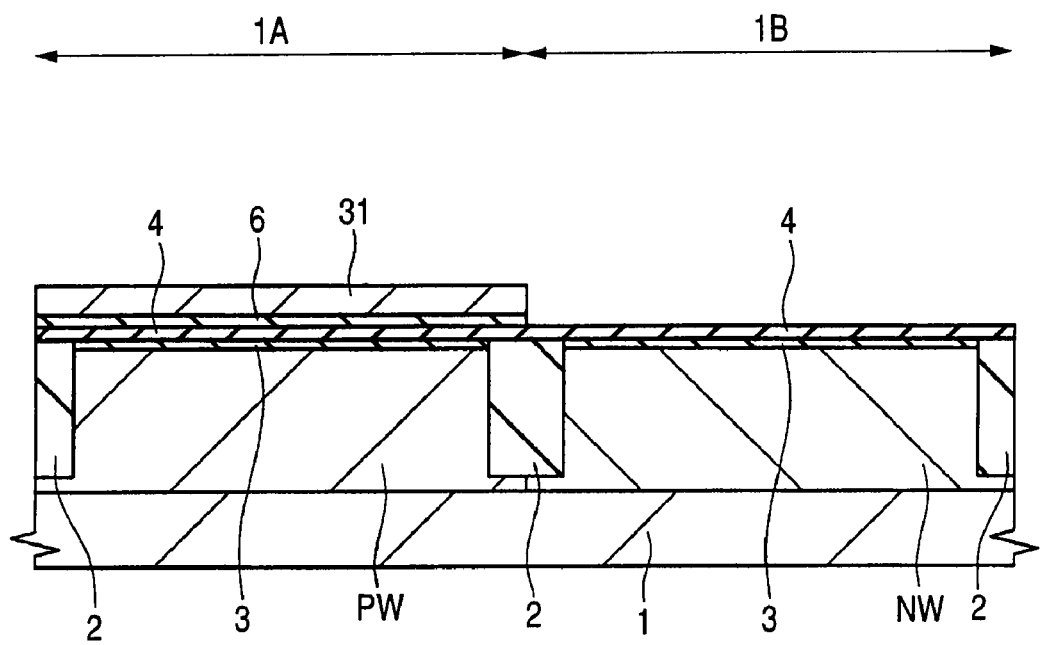
FIG. 31 is a cross-sectional view of a main part of the semiconductor device in a manufacturing step following the step shown in FIG. 30.
Figure 32:
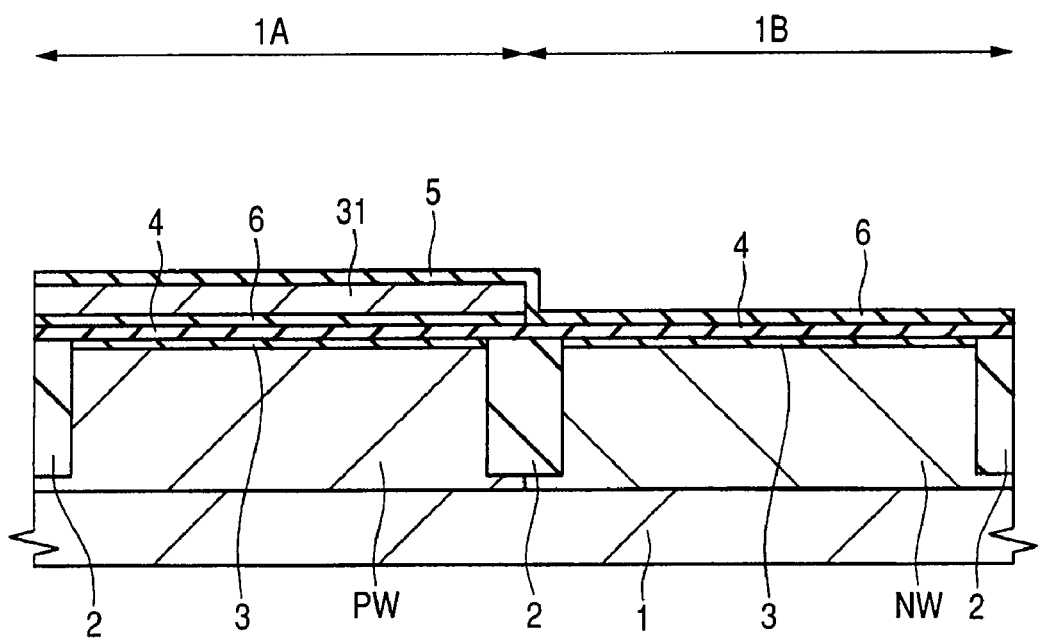
FIG. 32 is a cross-sectional view of a main part of the semiconductor device in a manufacturing step following the step shown in FIG. 31.
Figure 33:
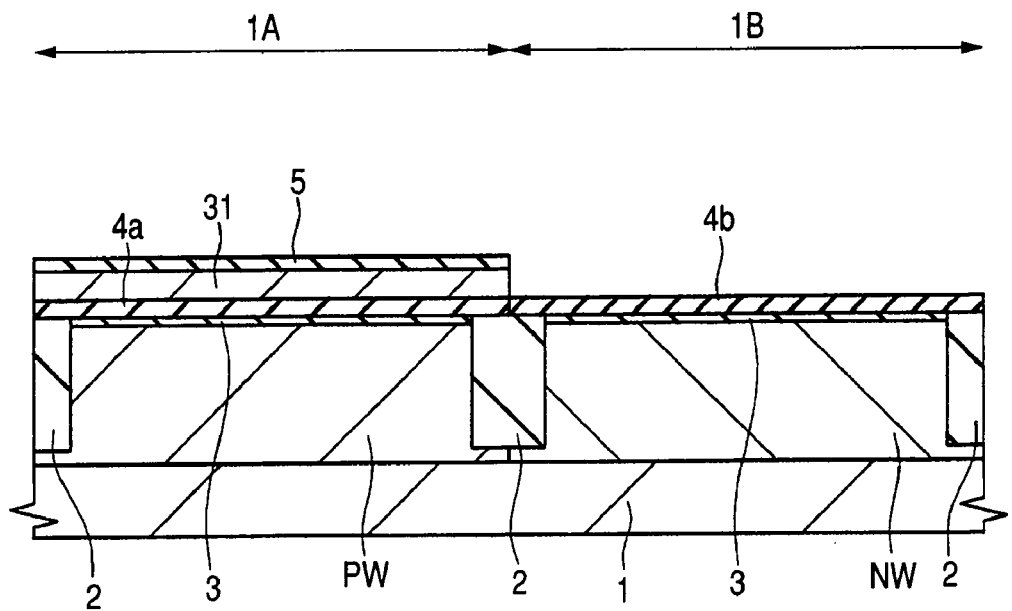
FIG. 33 is a cross-sectional view of a main part of the semiconductor device in a manufacturing step following the step shown in FIG. 32.
Figure 34:
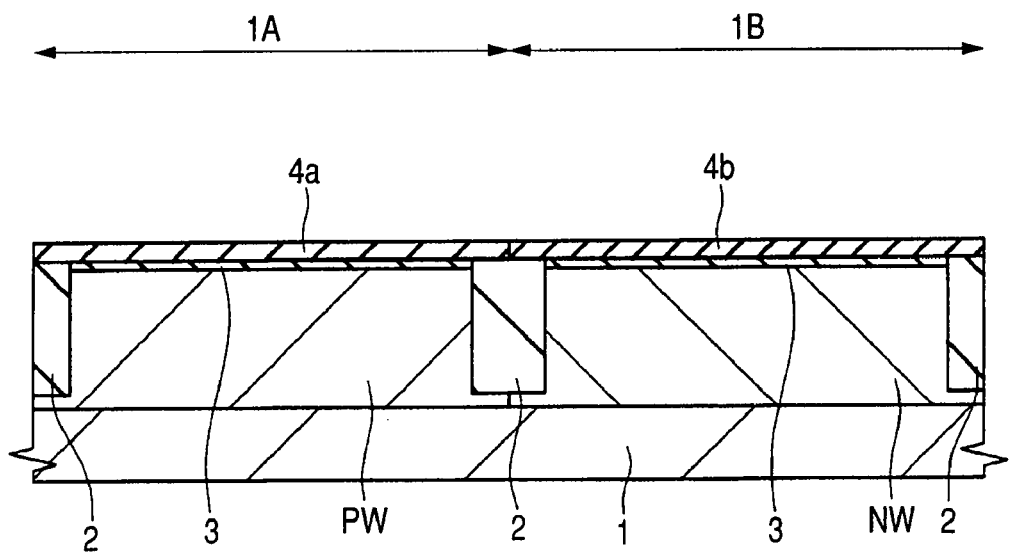
FIG. 34 is a cross-sectional view of a main part of the semiconductor device in a manufacturing step following the step shown in FIG. 33.

After the formation process of the Hf-containing film 4 in step S5 of the process flowchart shown in FIG. 2, the La-containing film 6 is formed instead of the Al-containing film 5 over the Hf-containing film 4 in step S6c (see FIG. 29). In step S6d, a mask layer 31 is formed over the La-containing film 6 (see FIG. 30). Then, in step S6e, the mask layer 31 and the La-containing film 6 in the pMIS formation region 1B are removed while leaving the mask layer 31 and the La-containing film 6 in the nMIS formation region 1A (see FIG. 31). Then, an Al-containing film 5 is formed instead of the La-containing film 6 in step S6f. That is, the Al-containing film 5 is formed over the mask layer 31 in the nMIS formation region 1A and over the Hf-containing film 4 in the pMIS formation region 1B (see FIG. 32). In this stage, in the nMIS formation region 1A, the interface layer 3, the Hf-containing film 4, the La-containing film 6, the mask layer 31, and the Al-containing film 5 are stacked over the p-type well PW in that order from the bottom. In the pMIS formation region 1B, the interface layer 3, the Hf-containing film 4, and the Al-containing film 5 are stacked over the n-type well NW in that order from the bottom. In the heat treatment at step S6g, the Hf-containing film 4 reacts (mixes, or interdiffuses) with the La-containing film 6 in the nMIS formation region 1A to form the Hf-containing insulating film 4a which is a reaction layer therebetween. Further, the Hf-containing film 4 reacts (mixes, or interdiffuses) with the Al-containing film 5 in the pMIS formation region 1B to form the Hf-containing insulating film 4b which is a reaction layer therebetween (see FIG. 33). At this time, the mask layer 31 intervenes between the Al-containing film 5 and the La-containing film 6 (and the Hf-containing film 4) in the nMIS formation region 1A. The mask layer 31 serves to prevent the Al-containing film in the nMIS formation region 1A from reacting with the La-containing film 6 or the Hf-containing film 4. Then, the unreacted Al-containing film 5 on the mask layer 31 is removed, and further the mask layer 31 is also removed in step S6h (see FIG. 34). If there are some unreacted parts of the La-containing film 6 (part not reacted by the heat treatment in step S6g), the unreacted parts can be removed together upon removing the mask layer 31 in step S6h. Until this process is completed, referring to FIG. 34, the same structure as that shown in FIG. 28 is obtained.

The following steps are the same as those of the first embodiment, and thus an illustration and description thereof will be omitted below. That is, the formation step of the metal film 7 in step S7 and the following steps are performed in the same way as the first embodiment.

This embodiment (manufacturing steps explained with reference to FIGS. 23 to 28 and manufacturing steps explained with reference to FIGS. 29 to 34) can also obtain substantially the same effects as those of the first embodiment. In addition to this, this embodiment can obtain the following effects by forming the Hf-containing insulating film 4a containing La and the Hf-containing insulating film 4b containing Al using the mask layer 31. That is, during the processes in steps of FIGS. 23 to 28, the heat treatment in step S6g can be performed while the La-containing film 6 exists not only in the nMIS formation region 1A but also in the pMIS formation region 1B, which eliminates the necessity of patterning the La-containing film 6 by etching. During the processes in steps of FIGS. 29 to 34, the heat treatment in step S6g can be performed while the Al-containing film 5 exists not only in the pMIS formation region 1B but also in the nMIS formation region 1A, which eliminates the necessity of patterning the Al-containing film 5 by etching. This arrangement can suppress or prevent the damage to the Hf-containing film 4 or the like. During the heat treatment in step S6g, the La-containing film 6 disposed on the Hf-containing film 4 in the nMIS formation region 1A maintains its thickness after being formed. And, the Al-containing film 5 disposed on the Hf-containing film 4 in the pMIS formation region 1B maintains its thickness after being formed. Thus, the amount of La introduced into the Hf-containing insulating film 4a and the amount of Al introduced into the Hf-containing insulating film 4b can be easily controlled.

Although the invention made by the inventors has been specifically described based on the embodiments, the invention is not limited to the embodiments disclosed therein. It will be apparent that various modifications and variations can be made to the embodiments without departing from the spirit and scope of the invention.

The invention is effectively applied to manufacturing techniques of semiconductor devices.

What is claimed is:

1. A manufacturing method of a semiconductor device, the semiconductor device including a first MISFET of an n-channel type in a first region of a semiconductor substrate, and a second MISFET of a p-channel type in a second region of the semiconductor substrate, the manufacturing method comprising the steps of:
   (a) preparing the semiconductor substrate;
   (b) respectively forming a first high dielectric constant gate insulator containing hafnium, lanthanum, and oxygen as a principal component in the first region over the semiconductor substrate, and a second high dielectric constant gate insulator containing hafnium, aluminum, and oxygen as a principal component in the second region over the semiconductor substrate;
   (c) forming a metal film over the first high dielectric constant gate insulator in the first region, and the second high dielectric constant gate insulator in the second region;
   (d) forming a first metal gate electrode of the first MISFET in the first region, and a second metal gate electrode of the second MISFET in the second region by patterning the metal film by dry etching; and
   (e) after the step (d), removing a part of the first high dielectric constant gate insulator not covered with the first metal gate electrode in the first region, and a part of the second high dielectric constant gate insulator not covered with the second metal gate electrode in the second region by wet etching,
   wherein the step (e) comprises the steps of:
   (e1) applying a wet process to the semiconductor substrate with a first acid solution not containing hydrofluoric acid;
   (e2) applying another wet process to the semiconductor substrate with an alkaline solution; and
   (e3) after the steps (e1) and (e2), applying a further wet process to the semiconductor substrate with a second acid solution containing hydrofluoric acid.

2. The manufacturing method of a semiconductor device according to claim 1,
   wherein in the step (d), the part of the first high dielectric constant gate insulator not covered with the first metal gate electrode in the first region, and the part of the second high dielectric constant gate insulator not covered with the second metal gate electrode in the second region are exposed.

3. The manufacturing method of a semiconductor device according to claim 2,
   wherein the first acid solution does not contain hydrofluoric acid and sulfuric acid.

4. The manufacturing method of a semiconductor device according to claim 3,
   wherein the first acid solution is a hydrochloric acid aqueous solution.

5. The manufacturing method of a semiconductor device according to claim 4,
   wherein the alkaline solution is an ammonia aqueous solution.

6. The manufacturing method of a semiconductor device according to claim 5, further comprising the step of:
   (c1) after the step (c) and before the step (d), forming a silicon film over the metal film,
   wherein in the step (d), the first metal gate electrode is formed in the first region, and the second metal gate electrode is formed in the second region by patterning the silicon film and the metal film by dry etching.

7. The manufacturing method of a semiconductor device according to claim 6,
wherein in the step (e1), a superficial part of the first high dielectric constant gate insulator not covered with the first metal gate electrode in the first region is removed,
wherein in the step (e2), a superficial part of the second high dielectric constant gate insulator not covered with the second metal gate electrode in the second region is removed, and
wherein in the step (e3), a remaining part of the first high dielectric constant gate insulator not covered with the first metal gate electrode in the first region is removed, and a remaining part of the second high dielectric constant gate insulator not covered with the second metal gate electrode in the second region is removed.

8. The manufacturing method of a semiconductor device according to claim 7,
wherein the second acid solution is an aqueous solution of hydrofluoric acid and hydrochloric acid.

9. The manufacturing method of a semiconductor device according to claim 8,
wherein the step (b) comprises the steps of:
(b1) forming a first Hf-containing film for formation of the first and second high dielectric constant gate insulators, in the first region and the second region over the semiconductor substrate, the first Hf-containing film containing hafnium and oxygen as a principal component;
(b2) forming an Al-containing film containing Al over the first Hf-containing film in the second region, and forming a La-containing film containing La over the first Hf-containing film in the first region; and
(b3) forming the first high dielectric constant gate insulator by reaction between the first Hf-containing film in the first region and the La-containing film, and forming the second high dielectric constant gate insulator by reaction between the first Hf-containing film in the second region and the Al-containing film by performing heat treatment after the step (b2).

10. The manufacturing method of a semiconductor device according to claim 9,
wherein the La-containing film is a lanthanum oxide film.

11. The manufacturing method of a semiconductor device according to claim 10,
wherein the Al-containing film is an aluminum oxide film, an aluminum oxynitride film, or an aluminum film.

12. The manufacturing method of a semiconductor device according to claim 9,
wherein the step (b1) comprises the steps of:
(b11) forming a first Hf-containing film for formation of the first and second high dielectric constant gate insulators, in the first region and the second region over the semiconductor substrate, the first Hf-containing film containing hafnium and oxygen as a principal component;
(b12) forming an Al-containing film containing Al as a principal component for formation of the second high dielectric constant gate insulator, over the first Hf-containing film formed in the first and second regions;
(b13) forming a mask layer over the Al-containing film formed in the first and second regions;
(b14) after the step (b13), removing the mask layer and the Al-containing film in the first region, and leaving the mask layer and the Al-containing film in the second region;
(b15) after the step (b14), forming a La-containing film containing La as a principal component for formation of the first high dielectric constant gate insulator, over the first Hf-containing film in the first region and over the mask layer in the second region;
(b16) forming the first high dielectric constant gate insulator by reaction between the first Hf-containing film in the first region and the La-containing film, and forming the second high dielectric constant gate insulator by reaction between the first Hf-containing film in the second region and the Al-containing film by performing heat treatment after the step (b15); and
(b17) after the step (b16), removing the mask layer and the La-containing film positioned over the mask layer in the second region.

13. The manufacturing method of a semiconductor device according to claim 12,
wherein the mask layer formed in the step (b13) is a metal nitride film or a metal carbide film.

14. The manufacturing method of a semiconductor device according to claim 13,
wherein the first Hf-containing film formed in the step (b11) is a HfO film, a HfON film, a HfSiO film, or a HfSiON film,
wherein the Al-containing film formed in the step (b12) is an aluminum oxide film, an aluminum oxynitride film, or an aluminum film, and
wherein the La-containing film formed in the step (b15) is a lanthanum oxide film.

15. The manufacturing method of a semiconductor device according to claim 1, further comprising the step of:
(a1) before the step (b), forming a first insulating film comprised of silicon oxide or silicon oxynitride in the first region and the second region over the semiconductor substrate,
where in the step (b), the first high dielectric constant gate insulator is formed over the first insulating film in the first region, and the second high dielectric constant gate insulator is formed over the first insulating film in the second region.

16. The manufacturing method of a semiconductor device according to claim 15,
wherein in the step (e3), the part of the first insulating film not covered with the first metal gate electrode in the first region, and the part of the first insulating film not covered with the second metal gate electrode in the second region are removed.

* * * * *